United States Patent
Lim et al.

(10) Patent No.: US 11,437,597 B2
(45) Date of Patent: Sep. 6, 2022

(54) ORGANIC ELECTROLUMINESCENCE DEVICE

(71) Applicant: Samsung Display Co., Ltd., Yongin-Si (KR)

(72) Inventors: Jin-O Lim, Hwaseong-si (KR); Seunggak Yang, Suwon-si (KR); Samil Kho, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 242 days.

(21) Appl. No.: 16/594,683

(22) Filed: Oct. 7, 2019

(65) Prior Publication Data
US 2020/0152902 A1    May 14, 2020

(30) Foreign Application Priority Data
Nov. 9, 2018 (KR) .................. 10-2018-0137571

(51) Int. Cl.
*H01L 51/00* (2006.01)
*C07F 15/00* (2006.01)
(Continued)

(52) U.S. Cl.
CPC ...... *H01L 51/5016* (2013.01); *H01L 27/3211* (2013.01); *H01L 51/0035* (2013.01); *H01L 51/5056* (2013.01); *H01L 51/5072* (2013.01)

(58) Field of Classification Search
CPC ............ H01L 51/5016; H01L 51/0035; H01L 51/5056; H01L 51/5072; H01L 51/504;
(Continued)

(56) References Cited

U.S. PATENT DOCUMENTS

| 8,461,574 B2 | 6/2013 | Nishimura et al. |
| 8,723,171 B2 | 5/2014 | Nishimura et al. |

(Continued)

FOREIGN PATENT DOCUMENTS

| EP | 2166589 | 3/2010 |
| JP | 2013-073759 | 4/2013 |

(Continued)

OTHER PUBLICATIONS

Bezvikonnyi, Oleksandr, et al. "Pyrenyl Substituted 1,8-Naphthalimide as a New Material for Weak Efficiency-Roll-off Red OLEDs: a Theoretical and Experimental Study," New Journal of Chemistry, vol. 42, No. 15, 2018, pp. 12492-12502., doi:10.1039/c8nj01866a.

(Continued)

*Primary Examiner* — Mary A Wilczewski
*Assistant Examiner* — Tsz K Chiu
(74) *Attorney, Agent, or Firm* — H.C. Park & Associates, PLC

(57) ABSTRACT

An organic electroluminescence device includes a first electrode, a hole transport region disposed on the first electrode, a first emission layer disposed on the hole transport region and including a first light-emitting host and a first light-emitting dopant, a second emission layer disposed on the first emission layer and including a first electron transport material and a second light-emitting dopant, an electron transport region disposed on the second emission layer and including a second electron transport material, and a second electrode disposed on the electron transport region, wherein a triplet energy of the first light-emitting host ($T1_a$), a triplet energy of the second light-emitting dopant ($T1_b$) and a triplet energy of the second electron transport material ($T1_c$) satisfy a relation of $T1_a < T1_b < T1_c$. High emission efficiency may be shown.

20 Claims, 5 Drawing Sheets

(51) Int. Cl.
*H01L 51/50* (2006.01)
*H01L 27/32* (2006.01)

(58) Field of Classification Search
CPC ............... H01L 51/5064; H01L 51/508; H01L 51/5076; H01L 27/3211; H01L 27/3216; H01L 27/3218; H01L 51/0032; H01L 51/005; H01L 51/0059; H01L 51/0062; H01L 51/5024; H01L 51/5036; C07F 15/0033
See application file for complete search history.

(56) References Cited

U.S. PATENT DOCUMENTS

| | | | | |
|---|---|---|---|---|
| 10,822,361 | B2* | 11/2020 | Zeng | H01L 51/5024 |
| 11,081,658 | B2* | 8/2021 | Boudreault | H01L 51/0085 |
| 11,271,190 | B2* | 3/2022 | Han | H01L 51/0072 |
| 11,299,502 | B2* | 4/2022 | Kim | C09K 11/06 |
| 2005/0006642 | A1* | 1/2005 | Tung | H01L 51/5016 |
| | | | | 257/40 |
| 2005/0057150 | A1 | 3/2005 | Kim et al. | |
| 2006/0232194 | A1* | 10/2006 | Tung | H01L 51/5004 |
| | | | | 313/506 |
| 2007/0001588 | A1* | 1/2007 | Boroson | H01L 27/3209 |
| | | | | 313/504 |
| 2009/0284139 | A1* | 11/2009 | Ushikubo | H01L 51/5036 |
| | | | | 313/504 |
| 2013/0168652 | A1 | 7/2013 | Nam et al. | |
| 2014/0070194 | A1 | 3/2014 | Lai | |
| 2015/0155515 | A1 | 6/2015 | Kim et al. | |

FOREIGN PATENT DOCUMENTS

| | | |
|---|---|---|
| KR | 10-0543003 | 1/2006 |
| KR | 10-2013-0078113 | 7/2013 |
| KR | 10-2016-0082895 | 7/2016 |

OTHER PUBLICATIONS

Srivastava, Ruby, and Laxmikanth Rao Joshi, "The Effect of Substituted 1,2,4-Triazole Moiety on the Emission, Phosphorescent Properties of the Blue Emitting Heteroleptic Iridium(III) Complexes and the OLED Performance: a Theoretical Study." Phys. Chem. Chem. Phys., vol. 16, No. 32, 2014, pp. 17284-17294., doi:10.1039/c4cp02368d.
Extended European Search Report dated Apr. 3, 2020, issued in European Patent Application 19203711.7.

* cited by examiner

ORGANIC ELECTROLUMINESCENCE DEVICE

CROSS-REFERENCE TO RELATED APPLICATION

This application claims priority from and the benefit of Korean Patent Application No. 10-2018-0137571, filed on Nov. 9, 2018, which is hereby incorporated by reference for all purposes as if fully set forth herein.

BACKGROUND

Field

Exemplary embodiments of the invention relates to an organic electroluminescence device.

Discussion of the Background

The development of an organic electroluminescence device as an image display device is being actively conducted. The organic electroluminescence device is different from a liquid crystal display device and is a so-called self-luminescent display device accomplishing displays via the recombination of holes and electrons injected from a first electrode and a second electrode in an emission layer and via light emission from a light-emitting material including an organic compound included in the emission layer.

In the application of the organic electroluminescence device in a display device, the increase of efficiency and life of the organic electroluminescence device is required and development of a material for an organic electroluminescence device stably accomplishing the requirement is consistently required.

The above information disclosed in this Background section is only for understanding of the background of the inventive concepts, and, therefore, it may contain information that does not constitute prior art.

SUMMARY

Devices constructed according to exemplary implementations/embodiments of the invention are capable of providing an organic electroluminescence device having improved efficiency.

Additional features of the inventive concepts will be set forth in the description which follows, and in part will be apparent from the description, or may be learned by practice of the inventive concepts.

According to one or more exemplary embodiments of the invention, an organic electroluminescence device includes a first electrode; a hole transport region disposed on the first electrode; a first emission layer disposed on the hole transport region, the first emission layer including a first light-emitting host and a first light-emitting dopant; a second emission layer disposed on the first emission layer and including a first electron transport material and a second light-emitting dopant; an electron transport region disposed on the second emission layer, the electron transport region including a second electron transport material; and a second electrode disposed on the electron transport region, wherein a triplet energy of the first light-emitting host ($T1_a$), a triplet energy of the second light-emitting dopant ($T1_b$) and a triplet energy of the second electron transport material ($T1_c$) satisfy a relation of $T1_a < T1_b < T1_c$.

A difference between the triplet energy of the second light-emitting dopant and the triplet energy of the first light-emitting host ($T1_b - T1_a$) may be equal to or greater than about 0.3 eV.

A difference between the triplet energy of the second electron transport material and the triplet energy of the second light-emitting dopant ($T1_c - T1_b$) may be triplet energy of the about 0.4 eV.

The triplet energy of the first light-emitting host ($T1_a$) may be equal to or greater than about 1.3 eV and equal to or less than about 2.0 eV.

The triplet energy of the second light-emitting dopant ($T1_b$) may be equal to or greater than about 1.7 eV and equal to or less than about 2.8 eV.

The triplet energy of the second electron transport material ($T1_c$) may be equal to or greater than about 2.2 eV and equal to or less than about 3.3 eV.

The electron transport region may include a plurality of organic layers, and an organic layer adjacent to the second emission layer among the organic layers may include the second electron transport material.

The electron transport region may include a buffer layer disposed on the second emission layer; an electron transport layer disposed on the buffer layer; and an electron injection layer disposed on the electron transport layer, wherein the buffer layer may include the second electron transport material.

The first emission layer may include a first sub emission layer, a second sub emission layer and a third sub emission layer, which are neighbored on a plane, and the first sub emission layer may include the first light-emitting host and the first light-emitting dopant.

the first light-emitting dopant and the second light-emitting dopant may be configured to emit lights of the same color.

The first sub emission layer may be a blue emission layer, the second sub emission layer may be a green emission layer, and the third sub emission layer may be a red emission layer.

The first light-emitting host may include a compound represented by the following Formula 1:

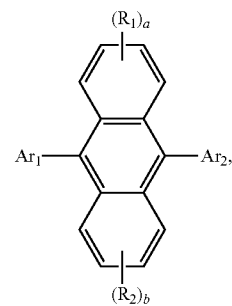

wherein $Ar_1$ and $Ar_2$ each independently may include at least one of a substituted or unsubstituted aryl group of 6 to 30 carbon atoms for forming a ring, and a substituted or unsubstituted heteroaryl group of 2 to 30 carbon atoms for forming a ring, wherein $R_1$ and $R_2$ each independently may include at least one of a hydrogen atom, a deuterium atom, a halogen atom, a cyano group, a substituted or unsubstituted silyl group, a substituted or unsubstituted alkyl group of 1 to 20 carbon atoms, a substituted or unsubstituted alkoxy group of 1 to 10 carbon atoms, a substituted or unsubstituted aryl group of 6 to 30 carbon atoms for forming a ring, a substituted or unsubstituted aryloxy group of 6 to 30 carbon atoms for forming a ring, and a substituted or unsubstituted heteroaryl group of 2 to 30 carbon atoms for forming a ring, and combined with an adjacent group to form a ring, and wherein "a" and "b" may be each independently an in integer of 0 to 4.

According to one or more exemplary embodiments of the invention, an organic electroluminescence device includes: a first pixel area, a second pixel area, and a third pixel area, which are neighbored in a plan view, each of the first pixel area, the second pixel area, and the third pixel area including: a first electrode; a hole transport region disposed on the first electrode; a first emission layer disposed on the hole transport region, the first emission layer including: a first sub emission layer overlapping with the first pixel area in the plan view; a second sub emission layer overlapping with the second pixel area in the plan view; and a third sub emission layer overlapping with the third pixel area in the plan view; a second emission layer disposed on the first emission layer, the second emission layer overlapping with the first pixel area, the second pixel area, and the third pixel area in the plan view; an electron transport region disposed on the second emission layer; and a second electrode disposed on the electron transport region, wherein the first sub emission layer includes a first light-emitting host and a first light-emitting dopant, wherein the second emission layer includes a first electron transport material and a second light-emitting dopant, wherein the electron transport region includes a second electron transport material, and wherein a triplet energy of the first light-emitting host ($T1_a$), a triplet energy of the second light-emitting dopant ($T1_b$) and a triplet energy of the second electron transport material ($T1_c$) satisfy a relation of $T1_a < T1_b < T1_c$.

A difference between the triplet energy of the second light-emitting dopant and the triplet energy of the first light-emitting host ($T1_b - T1_a$) may be equal to or greater than about 0.4 eV.

A difference between the triplet energy of the second electron transport material and the triplet energy of the second light-emitting dopant ($T1_c - T1_b$) is equal to or greater than about 0.5 eV.

The electron transport region may include: a buffer layer; an electron transport layer disposed on the buffer layer, and an electron injection layer disposed on the electron transport layer, wherein the buffer layer may include the second electron transport material and the buffer layer may be adjacent to the second emission layer.

The first light-emitting dopant and the second light-emitting dopant may be configured to emit blue light.

The second light-emitting dopant may be doped in a weight ratio of equal to or greater than about 3% and equal to or less than about 10% with respect to the first electron transport material.

According to one or more exemplary embodiments of the invention, an organic electroluminescence device, including: a first pixel area, a second pixel area, and a third pixel area, which are neighbored in a plan view, each of the first pixel area, the second pixel area, and the third pixel area including: a first electrode; a hole transport t region disposed on the first electrode; a first emission layer disposed on the hole transport region. the first emission layer including: a first sub emission layer overlapping with the first pixel area in the plan view; a second sub emission layer overlapping with the second pixel area in the plan view; and a third sub emission layer overlapping with the third pixel area in the plan view; a second emission layer disposed on the first emission layer, the second emission layer overlapping with the first pixel area, the second pixel area, and the third pixel area in the plan view; a buffer layer disposed on the second emission layer; an electron transport layer disposed on the buffer layer; an electron injection layer disposed on the electron transport layer; and a second electrode disposed on the electron injection layer, wherein the first sub emission layer includes a first light-emitting host and a first light-emitting dopant, wherein the second emission layer includes a first electron transport material and a second light-emitting dopant, and wherein the buffer layer comprises a second electron transport material, and wherein a triplet energy of the first light-emitting host ($T1_a$), a triplet energy of the second light-emitting dopant ($T1_b$) and a triplet energy of the second electron transport material ($T1_c$) satisfy a relation of $T1_a < T1_b < T1_c$.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
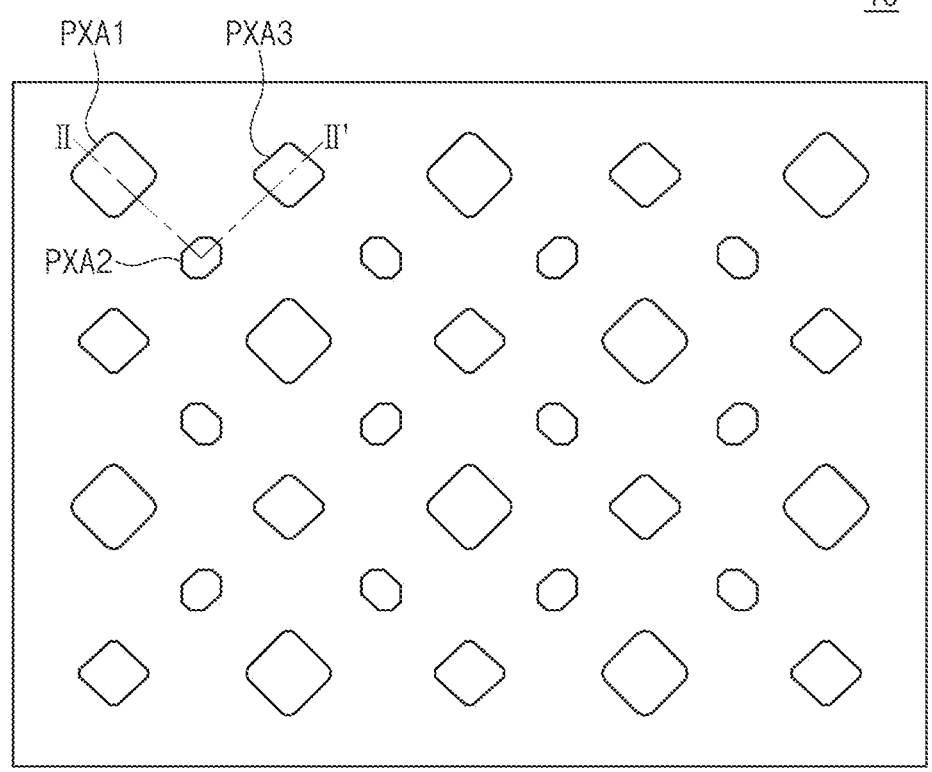
FIG. 1 is a plan view of an organic electroluminescence device according to an exemplary embodiment.
Figure 1:
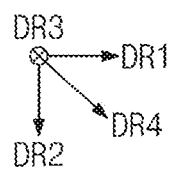

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

In the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the inventive concepts will be explained referring to attached drawings.

FIG. 1 is a plan view of an organic electroluminescence device 10 according to an exemplary embodiment. Referring to FIG. 1, an organic electroluminescence device includes a first pixel area PXA1, a second pixel area PXA2, and a third pixel area PXA3. The first pixel area PXA1, the second pixel area PXA2, and the third pixel area PXA3 may be disposed in neighboring positions on a plane, and may provide lights of different colors. For example, the first pixel area PXA1 may provide blue light, the second pixel area PXA2 may provide green light, and the third pixel area PXA3 may provide red light.

The areas of the first to third pixel areas PXA1, PXA2, and PXA3 may be different from each other. The area may mean an area on a planar view. For example, the area of the first pixel area PXA1 which provides blue light may be the largest, the area of the third pixel area PXA3 which provides red light may be the second largest. The area of the second pixel area PXA2 which provides green light may be the smallest, but exemplary embodiments are not limited thereto.

The arrangement structure of the pixel area shown in FIG. 1 may be referred to as a pentile structure. However, an exemplary embodiment of the arrangement structure of the pixel area shown in FIG. 1 is not limited thereto. For example, in another exemplary embodiment of the inventive concepts, the pixel area may have a stripe structure in which the first pixel area PXA1, the second pixel area PXA2 and the third pixel area PXA3 are arranged in order in a first direction DR1.

Figure 2:
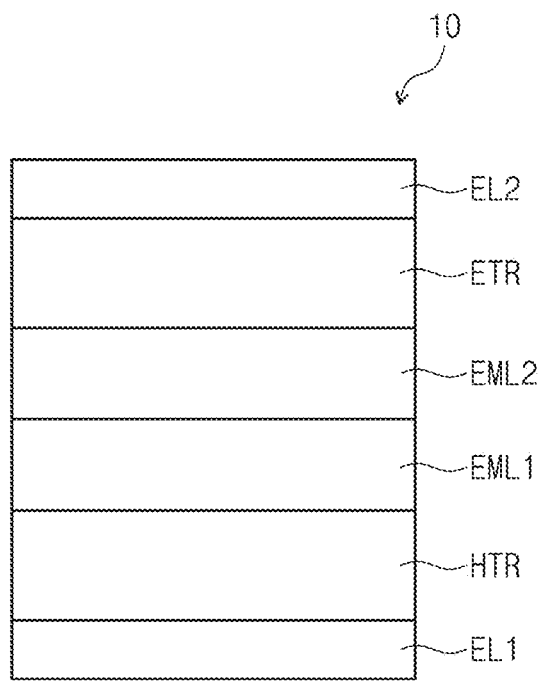
FIG. 2 is a cross-sectional view of an organic electroluminescence device according to an exemplary embodiment.

FIG. 2 is a cross-sectional view of an organic electroluminescence device according to an exemplary embodiment. FIG. 2 may be a across-sectional view of one pixel area.

Referring to FIG. 2, an organic electroluminescence device 10 includes a first electrode EL1, a second electrode EL2 oppositely disposed to the first electrode EL1, and may include a plurality of organic layers disposed between the first electrode EL1 and the second electrode EL2. The plurality of the organic layers may include a hole transport region HTR, a first emission layer EML1, a second emission layer EML2, and an electron transport region ETR.

In an exemplary embodiment, the first emission layer EML1 includes a first light-emitting host and a first light-emitting dopant, and the electron transport region ETR includes a second electron transport material. The second emission layer EML2 is disposed between the first emission layer EML1 and the electron transport region ETR, and includes a first electron transport material and a second light-emitting dopant.

In an exemplary embodiment, in the organic electroluminescence device 10, the triplet energy levels (T1) among the first emission layer EML1, the second emission layer EML2 and the electron transport region ETR are controlled. More particularly, the triplet energy of the second electron transport material ($T1_c$) is greater than the triplet energy of the first light-emitting host ($T1_a$) and the triplet energy of the second light-emitting dopant ($T1_b$), and the triplet energy of the second light-emitting dopant ($T1_b$) is greater than the triplet energy of the first light-emitting host ($T1_a$). That is, the triplet energy of the first light-emitting host ($T1_a$), the triplet energy of the second light-emitting dopant ($T1_b$) and the triplet energy of the second electron transport material ($T1_c$) satisfy the relation of $T1_a < T1_b < T1_c$. If the triplet energy levels are controlled as described above, the diffusion of the triplet excitons produced from the host of the first emission layer EML1 to a layer other than the first emission layer EML1 may be prevented or suppressed, and emission efficiency may be improved.

In an exemplary embodiment, a triplet energy difference between the second light-emitting dopant and the first light-emitting host ($T1_b - T1_a$) may be about 0.4 eV or more. If the triplet energy difference between the second light-emitting dopant and the first light-emitting host is about 0.4 eV or more, triplet excitons produced from the first light-emitting host do are not transported to the second light-emitting dopant, and the triplet excitons may be restrained in the first emission layer EML1 more efficiently.

In an exemplary embodiment, a triplet energy difference between the second electron transport material and the second light-emitting dopant ($T1_c - T1_b$) may be about 0.5 eV or more. If the triplet energy difference between the second electron transport material and the second light-emitting dopant is about 0.5 eV or more, the diffusion of the triplet excitons to a layer other than the first emission layer EML1 may be prevented or suppressed more efficiently.

In an exemplary embodiment, the triplet energy of the first light-emitting host ($T1_a$) may be about 1.3 eV to about 2.0 eV, but is not specifically limited as long as the relation of the triplet energy is satisfied.

In an exemplary embodiment, the triplet energy of the second light-emitting dopant ($T1_b$) may be about 1.7 eV to about 2.5 eV, but is not specifically limited as long as the relation of the triplet energy is satisfied.

In an exemplary embodiment, the triplet energy of the second electron transport material ($T1_c$) may be about 2.2 eV to about 3.2 eV, but is not specifically limited as long as the relation of the triplet energy is satisfied.

In the first emission layer EML1, the first light-emitting dopant may be doped in the first light-emitting host. In the second emission layer EML2, the second light-emitting dopant may be doped in the first electron transport material. In an exemplary embodiment, the doping ratio of the first light-emitting dopant and the doping ratio of the second light-emitting dopant may be the same or different, and the doping ratio of the first light-emitting dopant may be less than or equal to the doping ratio of the second light-emitting dopant. For example, the first light-emitting dopant may be doped in a weight ratio of about 0.1% to about 3% with respect to the first light-emitting host, and the second light-emitting dopant may be doped in a weight ratio of about 3% to about 10% with respect to the first electron transport material, without limitation.

In an exemplary embodiment, the first light-emitting dopant may emit light of the same color as the second light-emitting dopant. For example, if the first light-emitting dopant is a dopant emitting blue light, the second light-emitting dopant may also be a dopant emitting blue light. The first light-emitting dopant and the second light-emitting dopant may include the same compound. However, exemplary embodiments are not limited thereto, and the first light-emitting dopant and the second light-emitting dopant may include different compounds.

Figure 3:
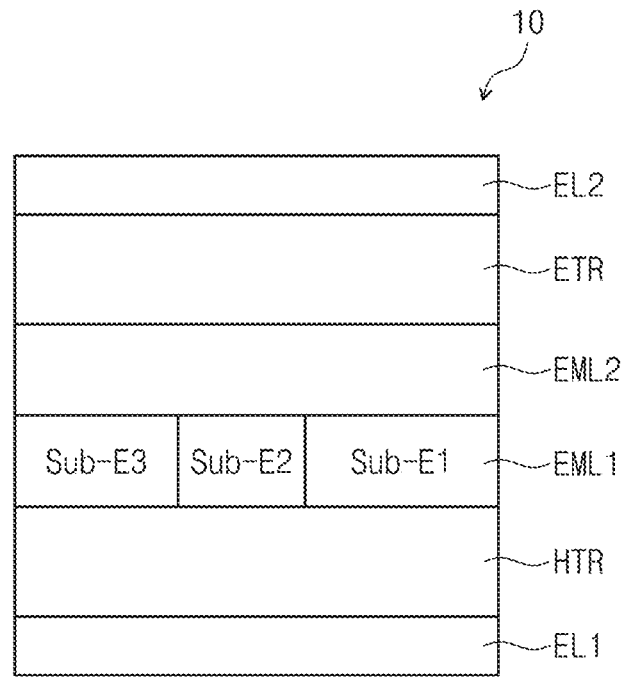
FIG. 3 is a cross-sectional view of an organic electroluminescence device according to an exemplary embodiment.

FIG. 3 is a cross-sectional view of an organic electroluminescence device according to an exemplary embodiment. FIG. 3 may be a cross-sectional view corresponding to pixel areas.

Referring to FIG. 3, a first emission layer EML1 may include a first sub emission layer Sub-E1, a second sub emission layer Sub-E2 and a third sub emission layer Sub-E3. The first sub emission layer Sub-E1, the second sub emission layer Sub-E2 and the third sub emission layer Sub-E3 may be emission layers emitting different colors. At least one layer among the first sub emission layer Sub-E1, the second sub emission layer Sub-E2 and the third sub emission layer Sub-E3 includes a first light-emitting host and a first light-emitting dopant. For example, the first sub emission layer Sub-E1 may include the first light-emitting host and the first light-emitting dopant.

Figure 4:
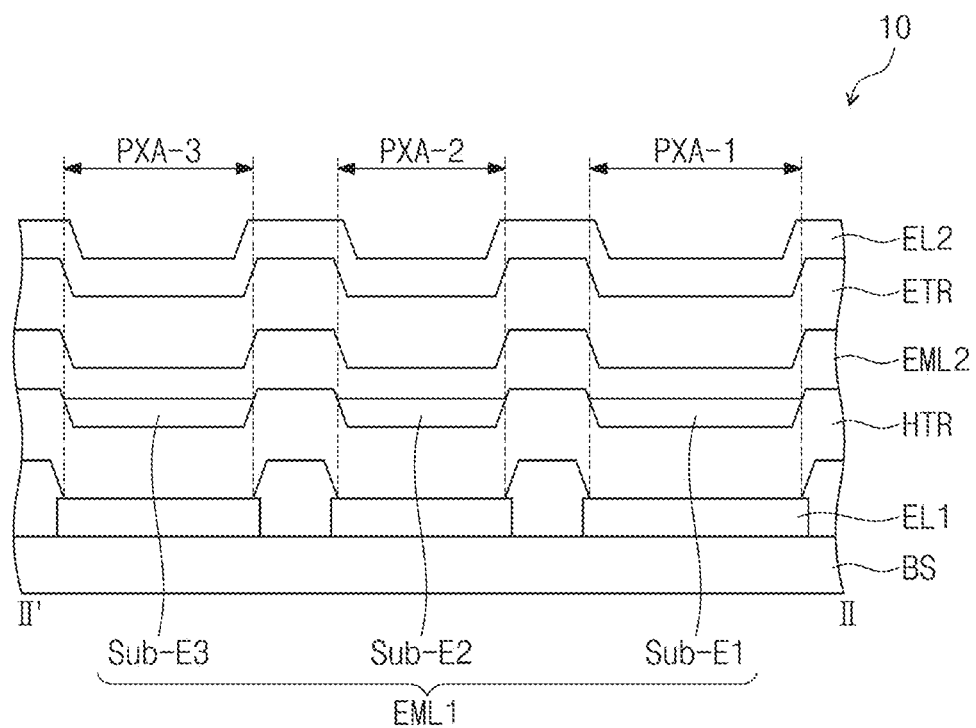
FIG. 4 is a cross-sectional view corresponding to a sectional line II-II' in FIG. 1.
Figure 5:
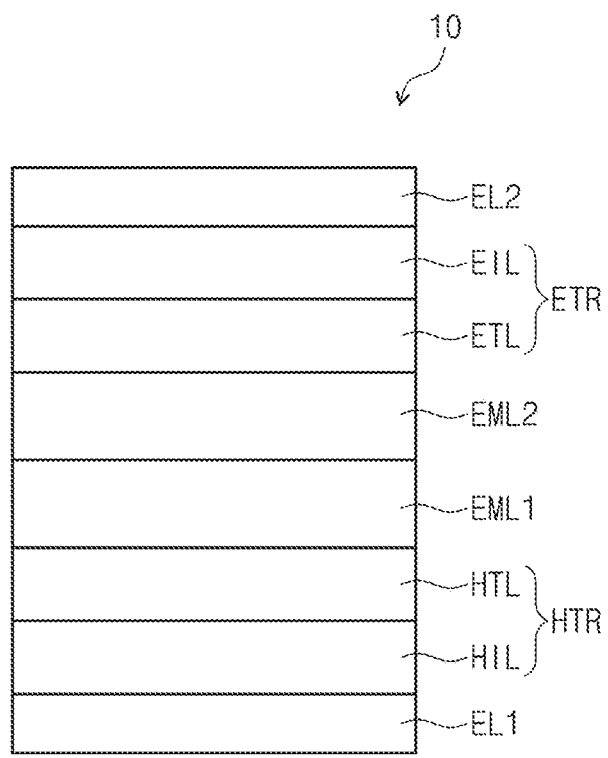
FIG. 5 is a cross-sectional view of an organic electroluminescence device according to an exemplary embodiment.
Figure 6:
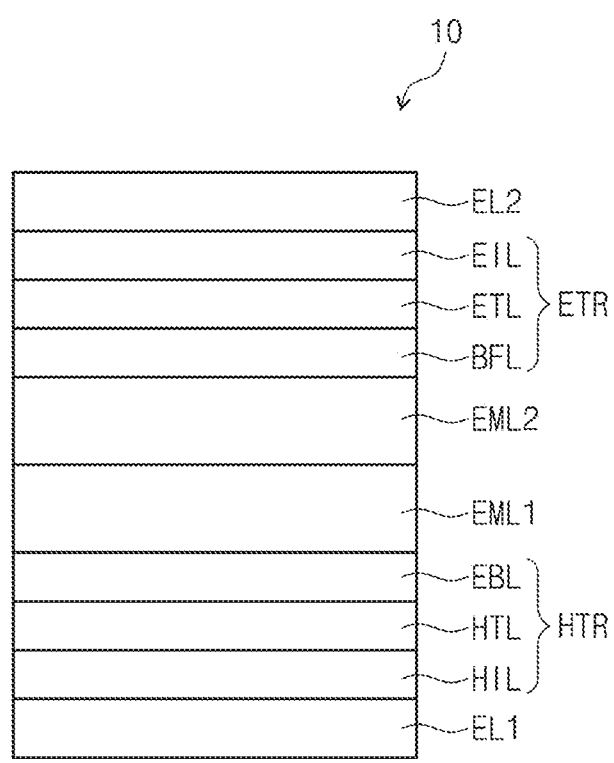
FIG. 6 is a cross-sectional view of an organic electroluminescence device according to an exemplary embodiment.

FIG. 4 is a cross-sectional view corresponding to a sectional line II-II' in FIG. 1. FIG. 5 is a cross-sectional view of an organic electroluminescence device according to an exemplary embodiment. FIG. 6 is a cross-sectional view of an organic electroluminescence device according to an exemplary embodiment.

Referring to FIG. 4, an organic electroluminescence device of an exemplary embodiment includes a first electrode EL1, a hole transport region HTR disposed on the first electrode EL1, a first emission layer EML1 disposed on the hole transport region HTR, a second emission layer EML2 disposed on the first emission layer EML1, an electron transport region ETR disposed on the second emission layer EML2, and a second electrode EL2 disposed on the electron transport region ETR, which are disposed on a base substrate BS.

The base substrate BS may be a glass substrate, a metal substrate, or a plastic substrate, but exemplary embodiments are not limited thereto.

The first electrode EL1 is disposed on the base substrate BS. The first electrode EL1 has conductivity. The first electrode EL1 may be a pixel electrode or an anode. The first electrode EL1 may be a transmissive electrode, a transflective electrode, or a reflective electrode. If the first electrode EL1 is the transmissive electrode, the first electrode EL1 may include a transparent metal oxide such as indium tin oxide (ITO), indium zinc oxide (IZO), zinc oxide (ZnO), and indium tin zinc oxide (ITZO). If the first electrode EL1 is the transflective electrode or reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may include a plurality of layers including the reflective layer or transflective layer formed using the above materials, and a transparent conductive layer formed using ITO, IZO, ZnO, or ITZO. For example, the first electrode EL1 may have a three-layer structure of ITO/Ag/ITO. However, exemplary embodiments are not limited thereto.

The thickness of the first electrode EL1 may be from about 1,000 Å to about 10,000 Å, for example from about 1,000 Å to about 3,000 Å.

The hole transport region HTR is disposed on the first electrode EL1. The hole transport region HTR may include at least one of a hole injection layer HIL, a hole transport layer HTL, a hole buffer layer, or an electron blocking layer EBL.

The hole transport region HTR may have a single layer formed using a single material, a single layer formed using a plurality of different materials, or a multilayer structure including a plurality of layers formed using a plurality of different materials. The hole transport region HTR may have the structure of a single layer such as a hole injection layer HIL and a hole transport layer HTL, or may have a structure of a single layer formed using a hole injection material and a hole transport material.

Referring to FIG. 5, a hole transport region HTR may have a structure stacked one by one from a first electrode EL1 of hole injection layer HIL/hole transport layer HTL. Referring to FIG. 6, a hole transport region HTR may have a structure stacked one by one from a first electrode EL1 of hole injection layer HIL/hole transport layer HTL/hole blocking layer EBL, without limitation.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL of the organic electroluminescence device 10 of an exemplary embodiment may include a known hole injection material. For example, the hole injection layer HIL may include a triphenylamine-containing polyether ketone (TPAPEK), 4-isopropyl-4'-methyldiphenyliodoniumtetrakis(pentafluorophenyl)borate (PPBI), N,N'-diphenyl-N,N'-bis-[4-(phenyl-m-tolyl-amino)-phenyl]-phenyl-4,4'-diamine (DNTPD), a phthalocyanine compound such as copper phthalocyanine, 4,4',4''-tris(3-methylphenylphenylamino)triphenylamine (m-MTDATA), N,N'-di(1-naphthyl)-N,N'-diphenylbenzidine (NPB), N,N'-bis(1-naphthyl)-N,N'-diphenyl-4,4'-diamine (α-NPD), 4,4',4''-tris(N,N-diphenylamino)triphenylamine (TDATA), 4,4',4''-tris(N,N-2-naphthylphenylamino)triphenylamine (2-TNATA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), dipyrazino[2,3-f: 2',3'-h] quinoxaline-2,3,6,7,10,11-hexacarbonitrile (HAT-CN), etc. However, exemplary embodiments are not limited thereto.

The hole transport layer HTL of the organic electroluminescence device 10 of an exemplary embodiment may include a known hole transport material. For example, the hole transport layer HTL may include 1,1-bis[(di-4-trileamino)phenyl]cyclohexane (TAPC), carbazole derivatives such as N-Phenyl carbazole and polyvinyl carbazole, N,N'-bis(3-methylphenyl)-N,N'-diphenyl-[1,1-biphenyl]-4, 4'-diamine (TPD), 4,4',4''-tris(N-carbazolyl)triphenylamine (TCTA), N,N'-di(1-naphthyl)-N,N'-diphenylbenzidine (NPB), N,N'-bis(1-naphthyl)-N,N'-diphenyl-4,4'-diamine (α-NPD), etc. However, exemplary embodiments are not limited thereto.

The electron blocking layer EBL is a layer playing the role of preventing or suppressing the injection of electrons from the electron transport region ETR to the hole transport region HTR. The electron blocking layer EBL may include common materials well-known in the art. The electron blocking layer EBL may include, for example, carbazole derivatives such as N-phenyl carbazole and polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4''-tris(N-carbazolyl)triphenylamine (TCTA), N,N'-di(naphthalene-1-yl)-N,N'-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), mCP, etc.

The thickness of the hole transport region HTR may be from about 100 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy the above-described ranges, satisfactory hole transport properties may be obtained without substantial increase of a driving voltage.

The hole transport region HTR may further include a charge generating material in addition to the above-described materials to increase conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, without limitation. For example, non-limiting examples of the p-dopant may include quinone derivatives such as tetracyanoquinodimethane (TCNQ) and 2,3,5,6-tetrafluoro-tetracyanoquinodimethane (F4-TCNQ), metal oxides such as tungsten oxide and molybdenum oxide, etc. without limitation.

The first emission layer EML1 is disposed on the hole transport region HTR. The first emission layer EML1 may be thicker than the second emission layer EML2 which will be explained later. For example, the thickness ratio of the first emission layer EML1 and the second emission layer EML2 may be about 2:1 to about 5:1. The thickness of the first emission layer EML1 is not specifically limited as long as it satisfies the above-mentioned ratio, and may have a thickness of, for example, from about 100 Å to about 1,000 Å, or from about 100 Å to about 500 Å. The first emission layer EML1 may have a single layer formed using a single material, a single layer formed using a plurality of different materials, or a multilayer structure having a plurality of layers formed using a plurality of different materials.

The first emission layer EML1 may include, for example, a fluorescence-emitting material, a phosphorescence-emitting material, or a light-emitting material for thermally activated delayed fluorescence, without limitation. In an exemplary embodiment, the first emission layer EML1 may include a first light-emitting host and a first light-emitting dopant.

In an exemplary embodiment, a material for the first light-emitting host is not specifically limited as long as it satisfies the relation of the triplet energy according to an exemplary embodiment, and for example, the first light-emitting host may include an anthracene-based compound.

In the description, the term "substituted or unsubstituted" corresponds to substituted or unsubstituted with at least one substituent selected from the group consisting of a deuterium atom, a halogen atom, a cyano group, a nitro group, an amino group, a silyl group, a boron group, a phosphine oxide group, a phosphine sulfide group, an alkyl group, an alkenyl group, an aryl group, and a heterocyclic group. In addition, each of the substituents may be substituted or unsubstituted. For example, a biphenyl group may be interpreted as an aryl group or a phenyl group substituted with a phenyl group.

In the description, the term "forming a ring via the combination with an adjacent group" may mean forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be a monocyclic ring or a polycyclic ring. In addition, the ring formed via the combination with an adjacent group may be combined with another ring to form a spiro structure.

In the description, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

In the description, examples of the halogen atom may be a fluorine atom, a chlorine atom, a bromine atom or an iodine atom.

In the description, the alkyl may be a linear, branched or cyclic type. The carbon number of the alkyl may be 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexyihexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the alkoxy group may mean an alkyl group in which an oxygen atom is bonded to the above-defined alkyl group. Examples of the alkoxy group may include a methoxy group, an ethoxy group, a propoxy group, an isobutyloxy group, a sec-butyloxy group, a pentyloxy group, an iso-amyloxy group, a hexyloxy group, etc., without limitation.

In the description, the aryl group means an optional functional group or substituent derived from an aromatic hydrocarbon ring. The aryl group may be a monocyclic aryl group or a polycyclic aryl group. The carbon number for forming a ring in the aryl group may be 6 to 60, 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylene, pyrenyl, benzofluoranthenyl, chrysenyl, etc., without limitation.

In the description, the fluorenyl group may be substituted, and two substituents may be combined with each other to form a spiro structure. Examples of a substituted fluorenyl group are as follows. However, exemplary embodiments are not limited thereto.

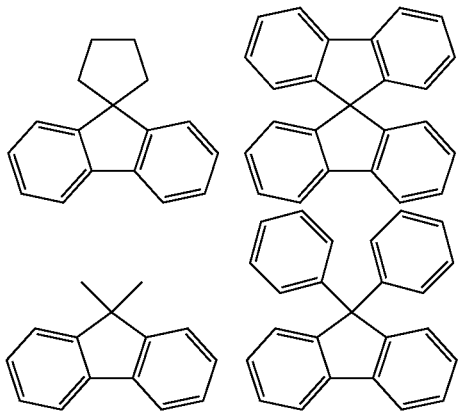

In the description, the aryloxy group may mean an aryl group in which an oxygen atom is bonded to the above-defined aryl group. Examples of the aryl group may include a phenoxy group, a p-tolyloxy group, a m-tolyloxy group, a 3,5-dimethyl-phenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group, etc., without limitation.

In the description, the heterocyclic group may be a heterocyclic group including one or more among B, O, N, P, Si and S as a heteroatom. If the heterocyclic group includes two or more heteroatoms, the two or more heteroatoms may be the same or different. The heterocyclic group may be a monocyclic heterocyclic group or a polycyclic heterocyclic group, and has the concept including a heteroaryl group. The carbon number for forming a ring of the heterocyclic group may be 2 to 30, 2 to 20, or 2 to 10. Examples of the heterocyclic group may include thiophene, furan, pyrrole, imidazole, thiazole, oxazole, oxadiazole, triazole, pyridine, bipyridine, pyrimidinel, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxadiazole, thiadiazole, phenothiazine, dibenzosilole, dibenzofuran, etc., without limitation.

In the description, the silyl group includes an alkyl silyl group and an aryl silyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, exemplary embodiments are not limited thereto.

The first light-emitting host may include a compound represented by the following Formula 1:

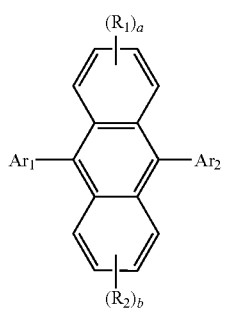

[Formula 1]

In Formula 1, $Ar_1$ and $Ar_2$ may be each independently a substituted or unsubstituted aryl group of 6 to 30 carbon atoms for forming a ring, or a substituted or unsubstituted heteroaryl group of 2 to 30 carbon atoms for forming a ring.

In an exemplary embodiment, $Ar_1$ and $Ar_2$ may be each independently a substituted or unsubstituted phenyl group, a substituted or unsubstituted naphthyl group, a substituted or unsubstituted phenanthryl group, a substituted or unsubstituted biphenyl group, a substituted or unsubstituted fluorenyl group, a substituted or unsubstituted pyrenyl group, or a substituted or unsubstituted dibenzofuranyl group.

In Formula 1, $R_1$ and $R_2$ may be each independently a hydrogen atom, a deuterium atom, a halogen atom, a cyano group, a substituted or unsubstituted silyl group, a substituted or unsubstituted alkyl group of 1 to 20 carbon atoms, a substituted or unsubstituted alkoxy group of 1 to 10 carbon atoms, a substituted or unsubstituted aryl group of 6 to 30 carbon atoms for forming a ring, a substituted or unsubstituted aryloxy group of 6 to 30 carbon atoms for forming a ring, or a substituted or unsubstituted heteroaryl group of 2 to 30 carbon atoms for forming a ring, or combined with an adjacent group to form a ring.

In Formula 1, "a" and "b" may be each independently an in integer of 0 to 4. Meanwhile, if "a" is 2 or more, a plurality of $R_1$ groups may be the same or different, and if "b" is 2 or more, a plurality of $R_2$ groups may be the same or different.

The first light-emitting host may be one selected among the compounds represented in the following Compound Group 1, but exemplary embodiments are not limited thereto:

[Compound Group 1]

1-1
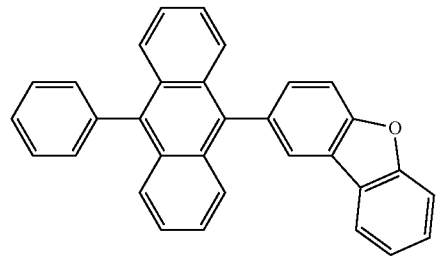

1-2
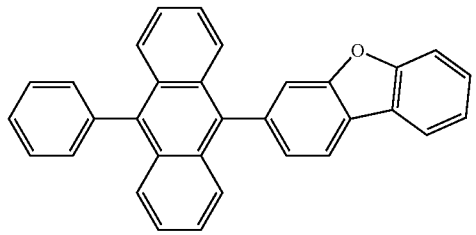

1-3
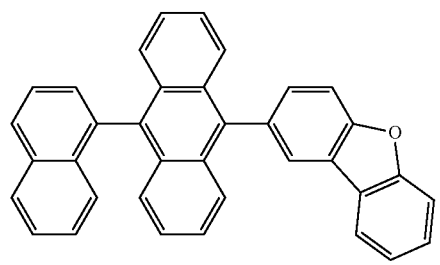

1-4
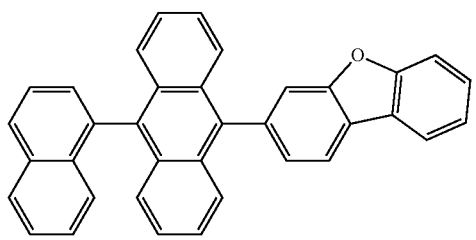

1-5
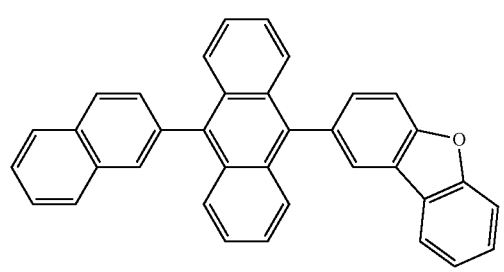

1-6
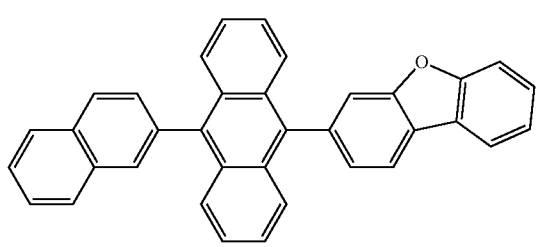

-continued
1-7
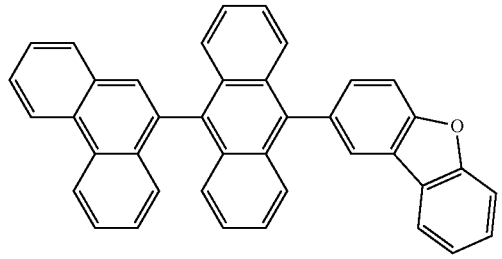
1-8
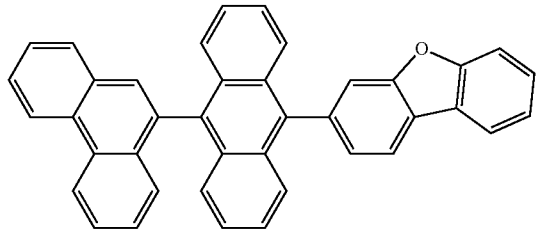
1-9
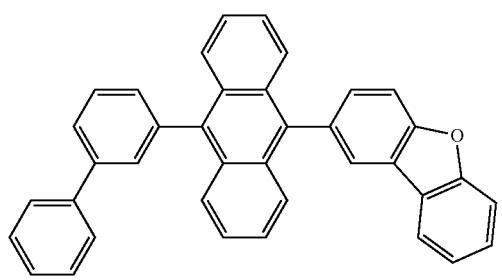
1-10
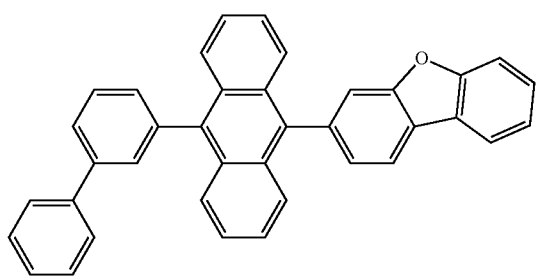
1-11
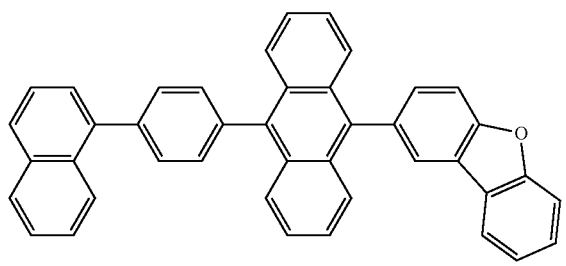
1-12
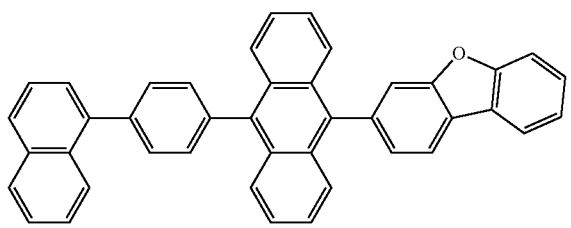
1-13
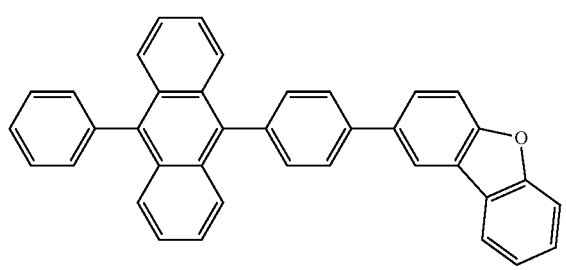
1-14
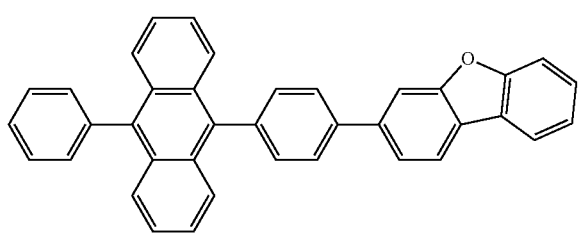
1-15
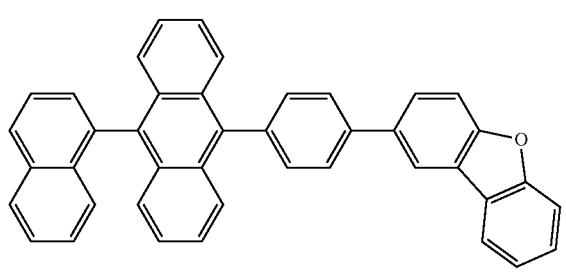
1-16
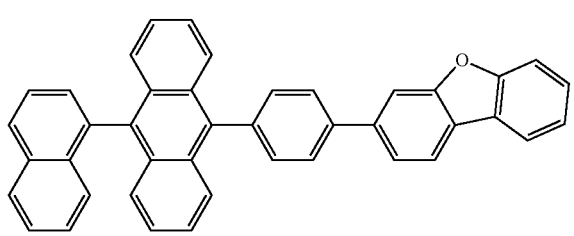

-continued
1-17
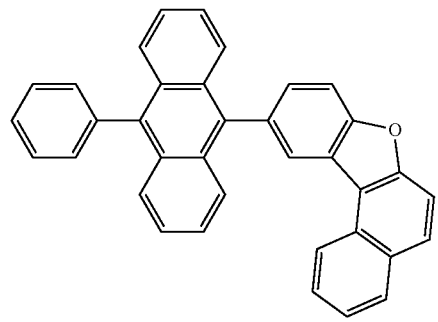
1-18
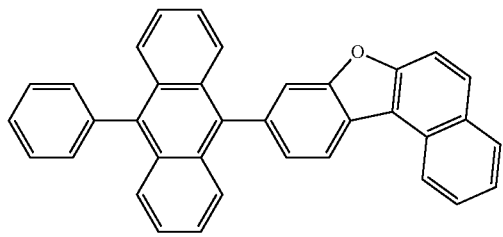
1-19
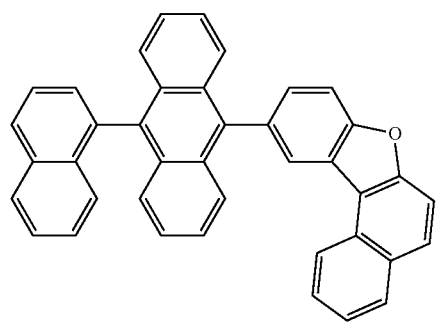
1-20
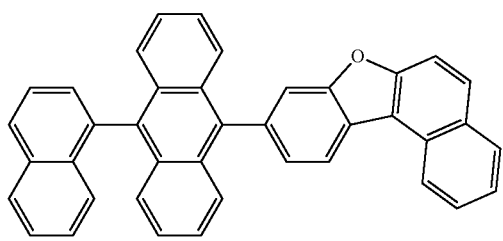
1-21
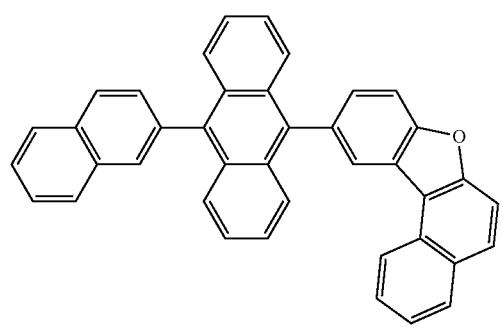
1-22
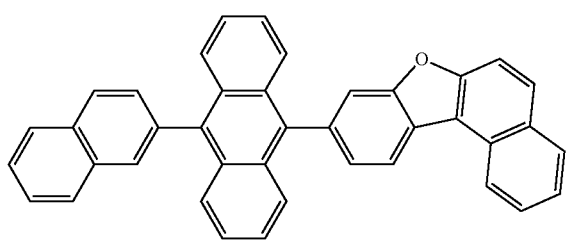
1-23
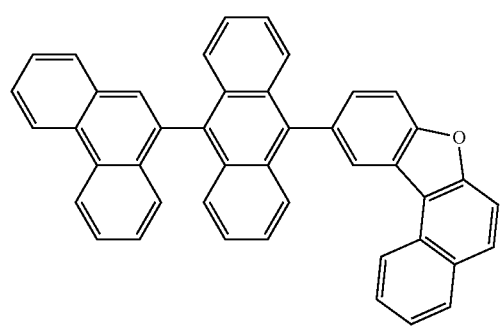
1-24
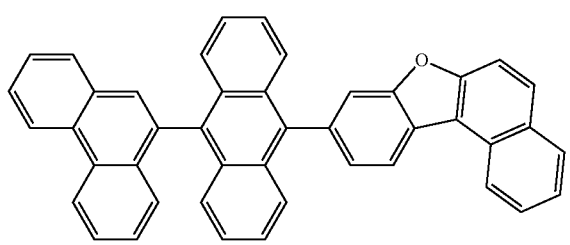

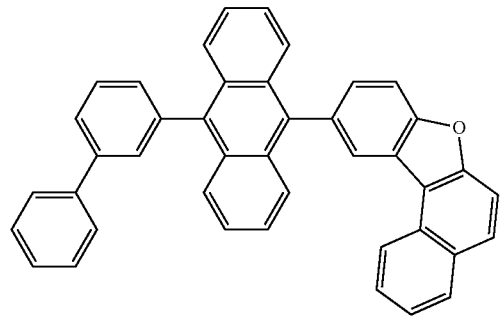

-continued
1-33
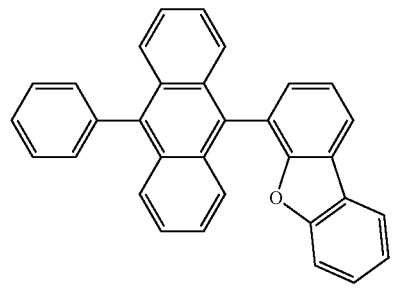
1-34
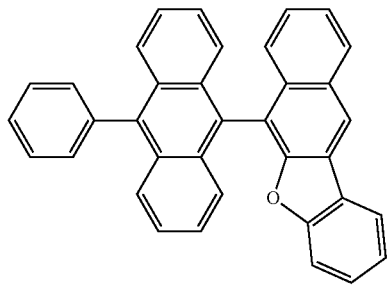
1-35
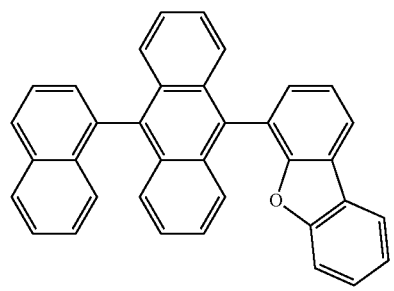
1-36
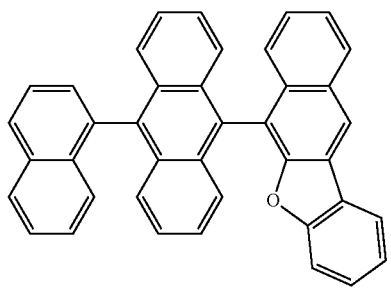
1-37
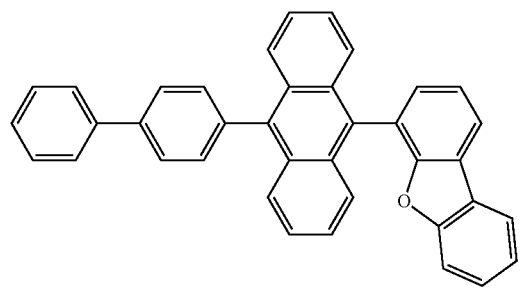
1-38
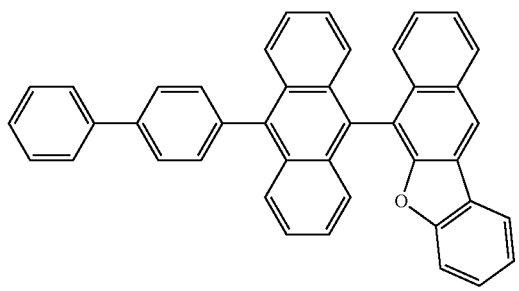
1-39
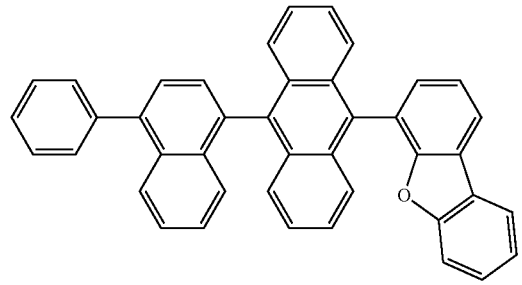
1-40
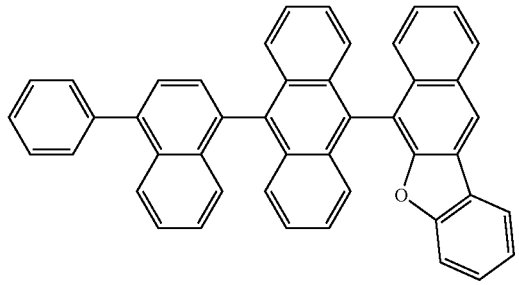
1-41
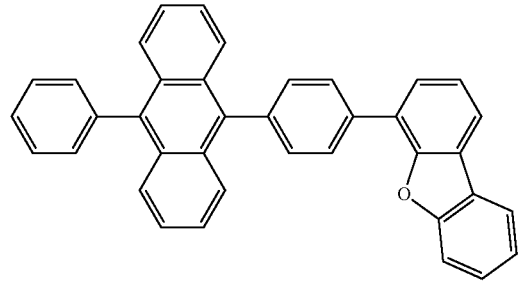
1-42
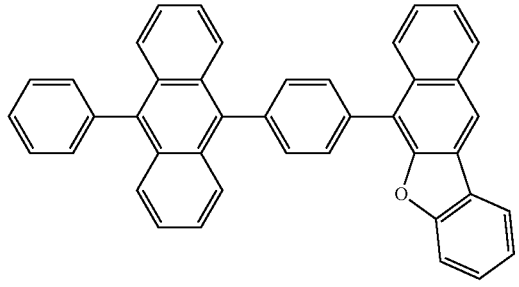

-continued
1-43
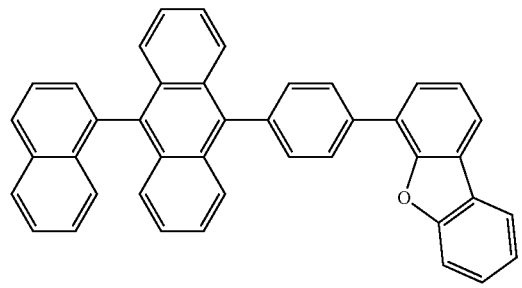
1-44
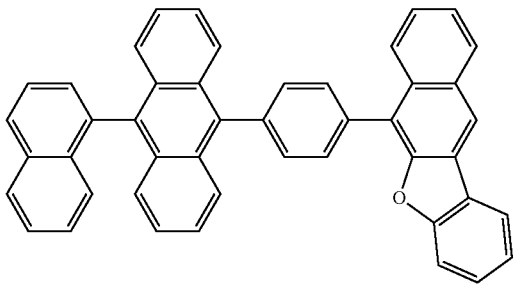
1-45
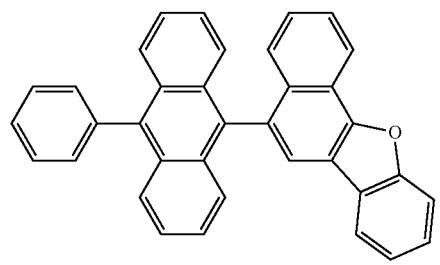
1-46
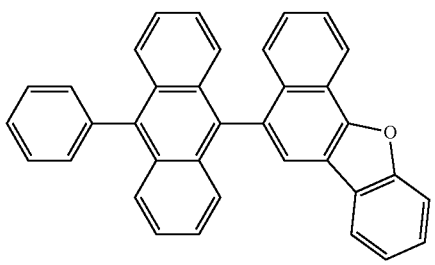
1-47
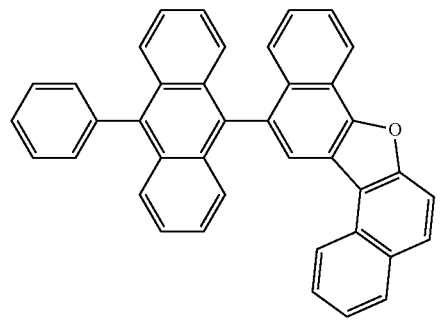
1-48
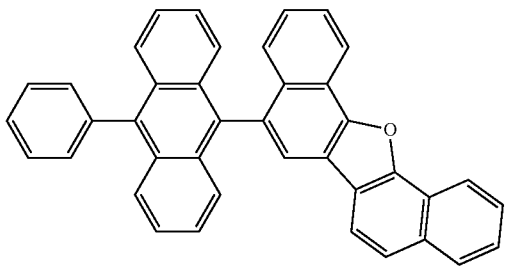
1-49
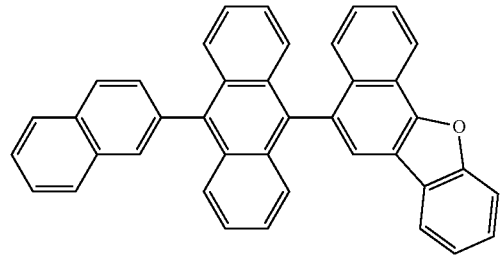
1-50
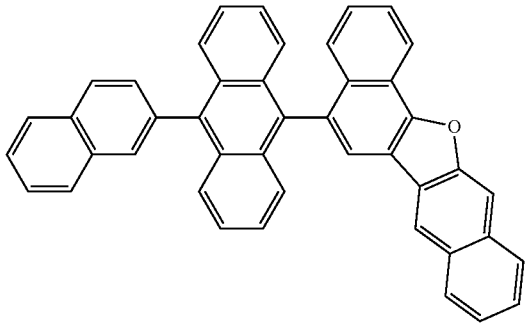
1-51
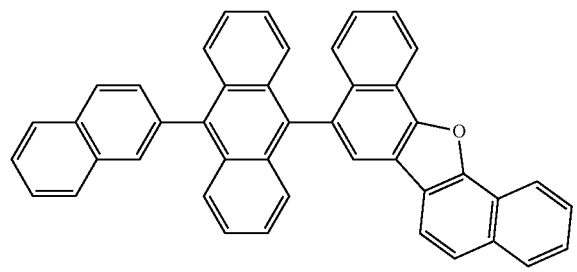
1-52
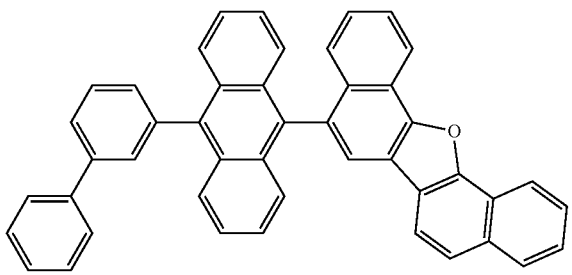

-continued
1-53
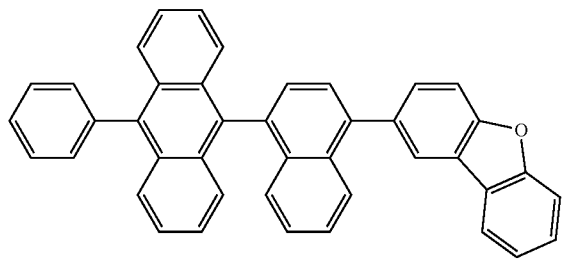
1-54
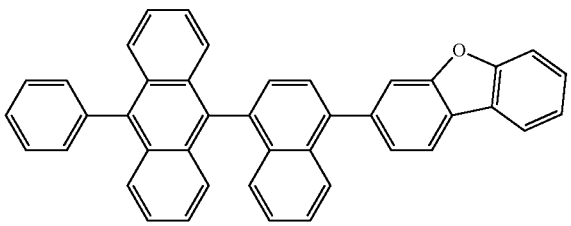
1-55
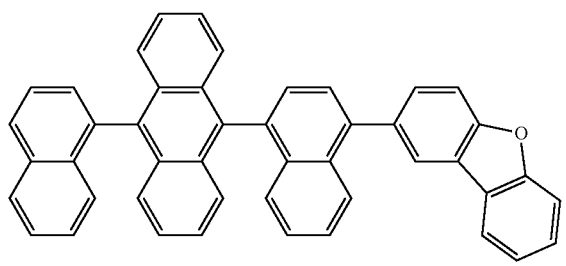
1-56
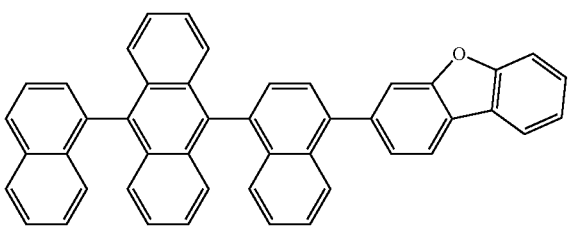
1-57
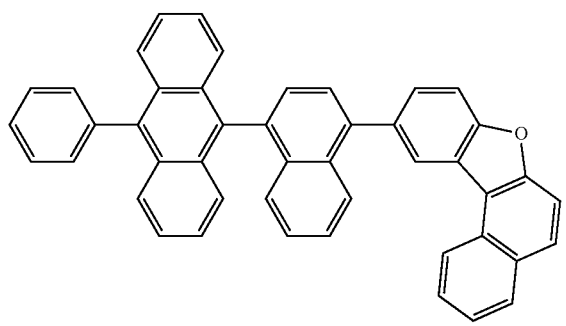
1-58
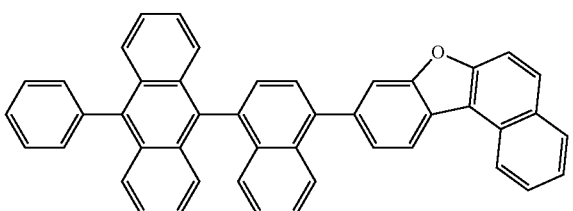
1-59
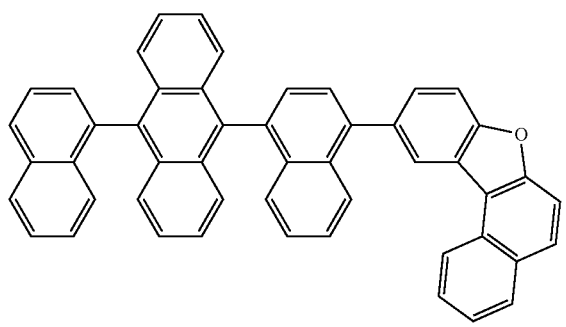
1-60
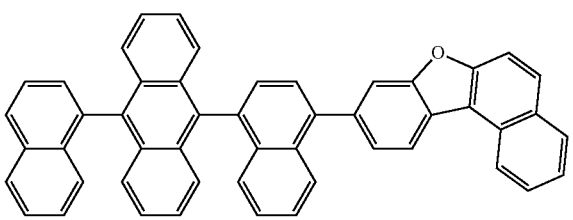
1-61
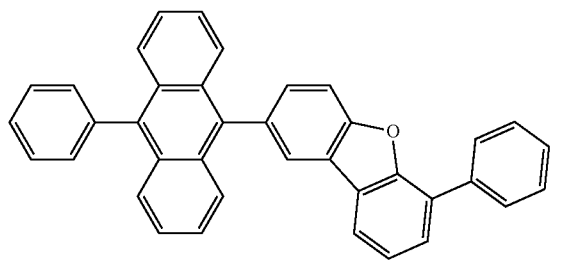
1-62
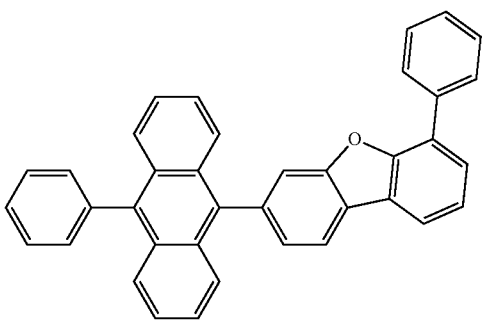

-continued
1-63
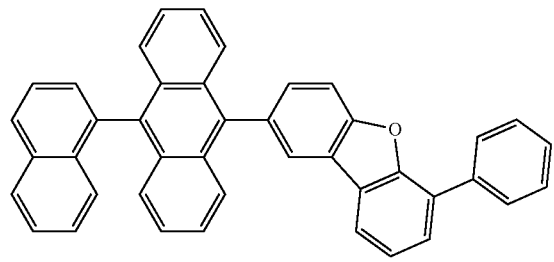
1-64
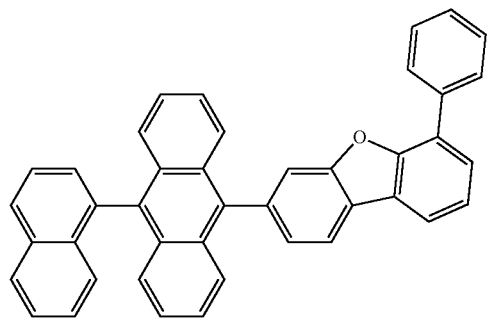
1-65
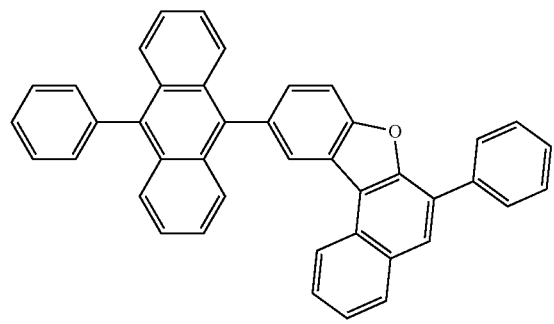
1-66
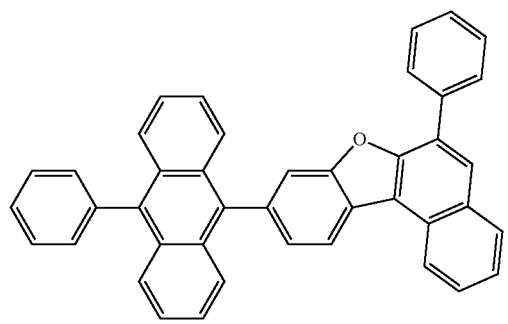
1-67
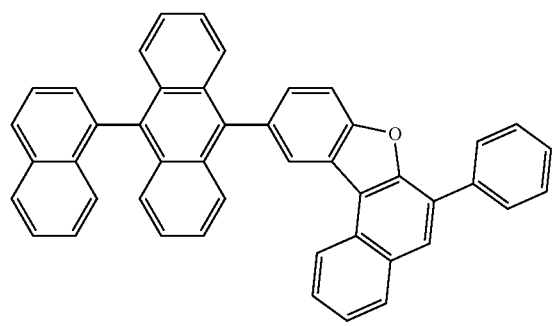
1-68
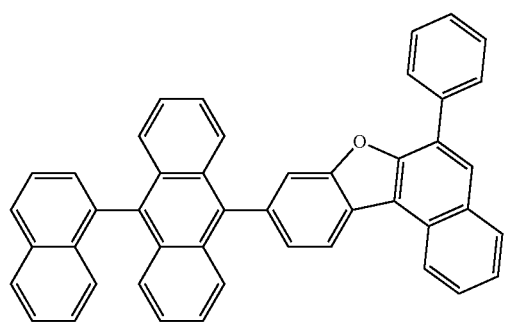
1-69
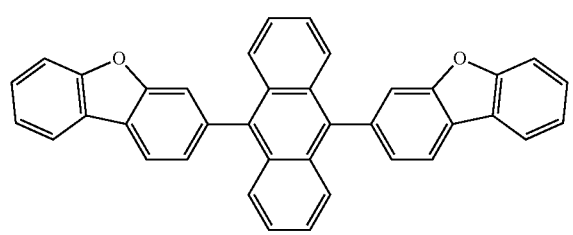
1-70
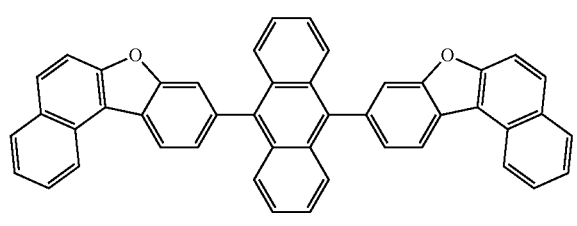
1-71
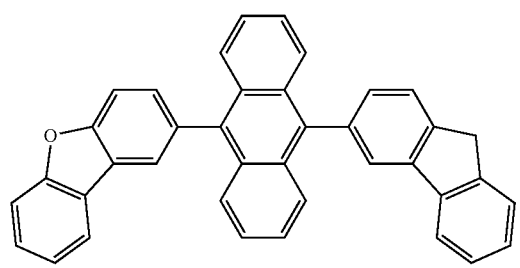
1-72
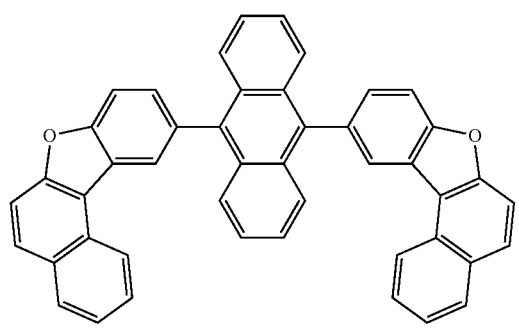

1-73
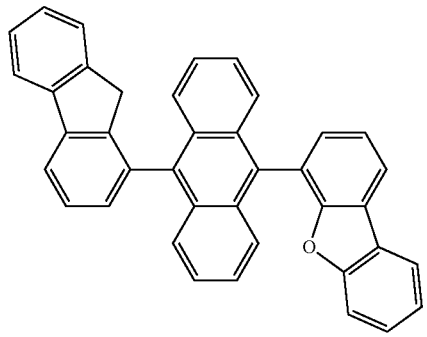
1-74
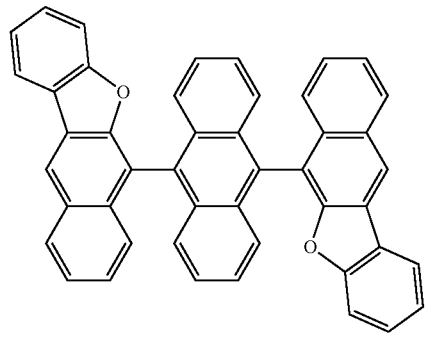
1-75
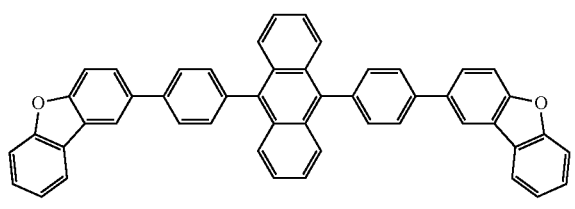
1-76
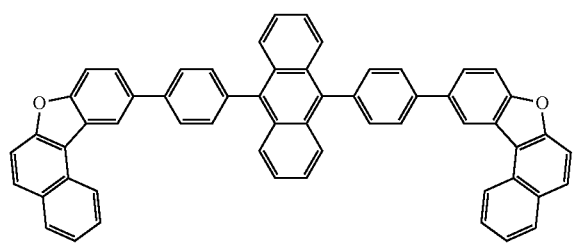
1-77
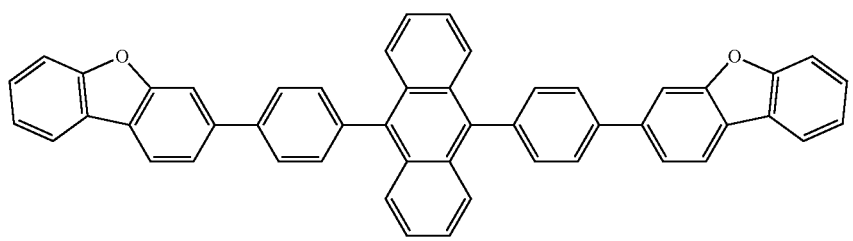
1-78
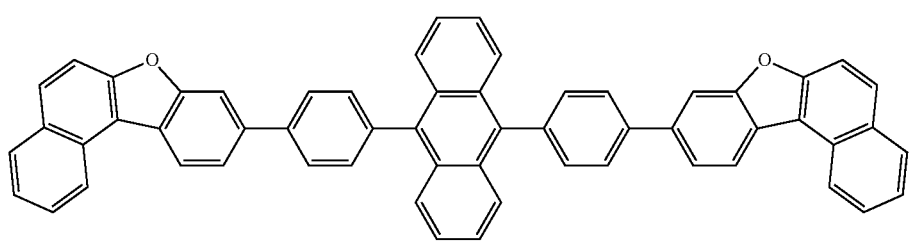
1-78
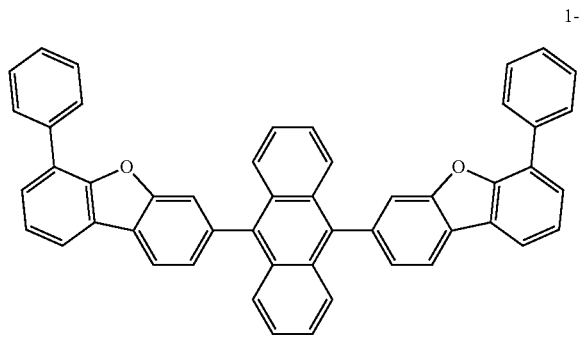
1-79
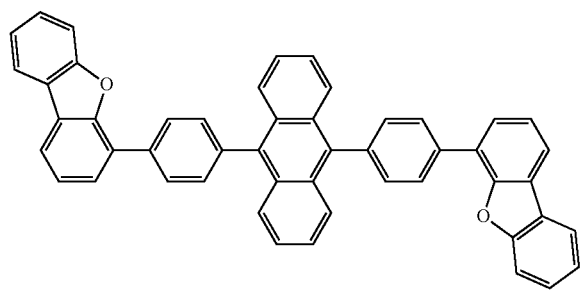

-continued
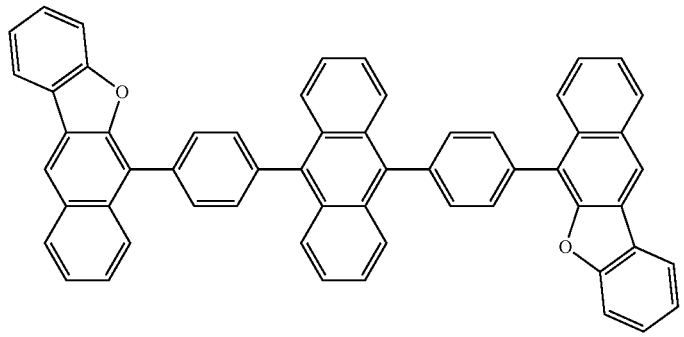
1-80
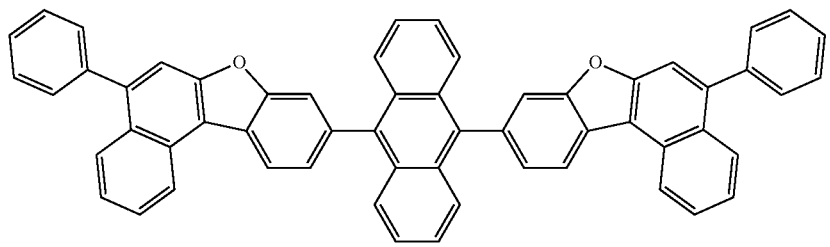
1-81
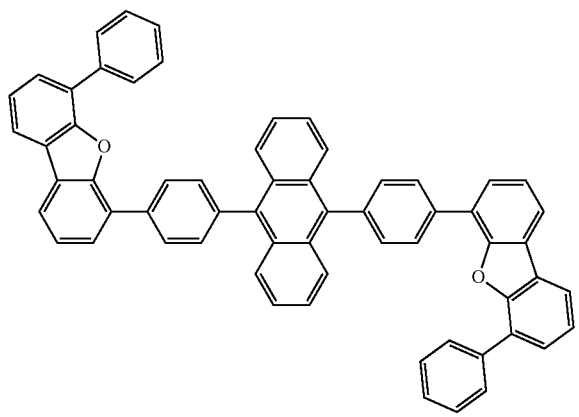
1-82
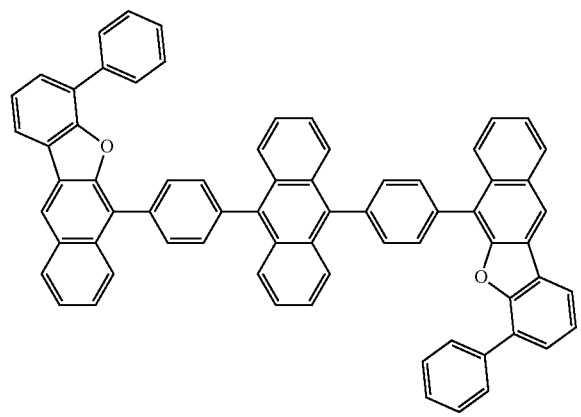
1-83
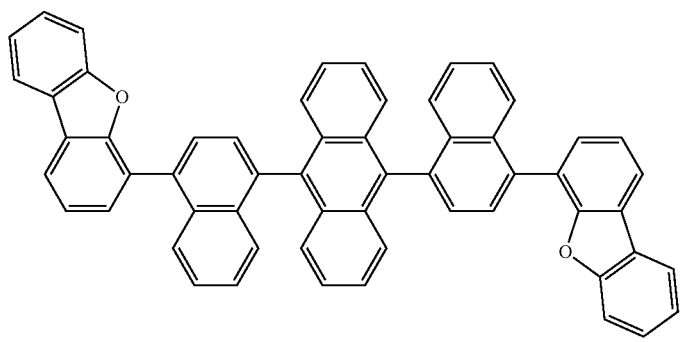
1-84

-continued
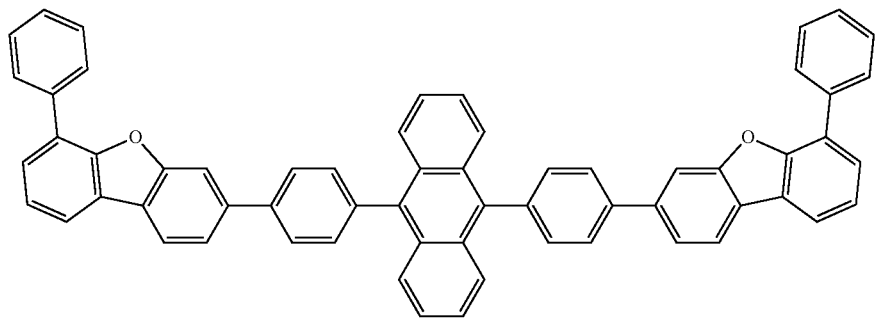
1-86
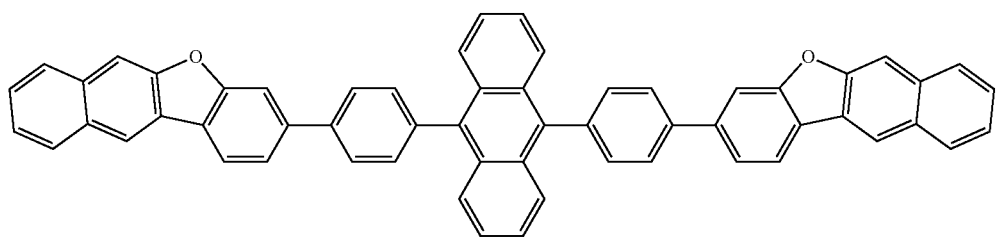
1-87
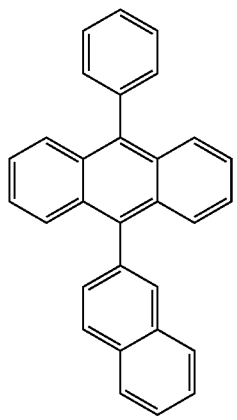
1-88
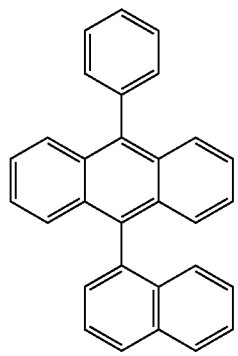
1-89
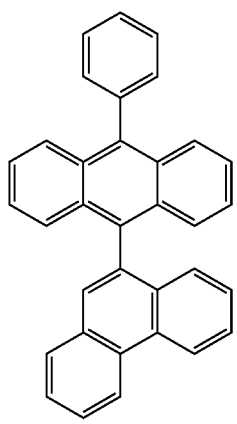
1-90
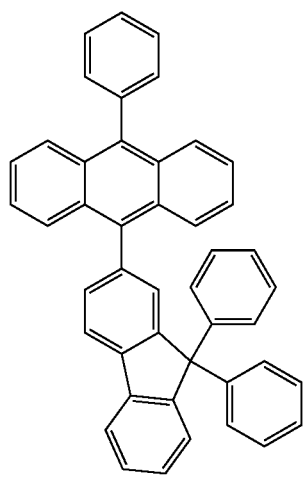
1-91

-continued
1-92
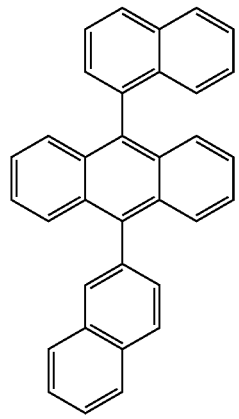
1-93
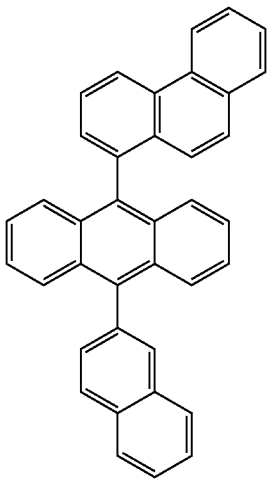
1-94
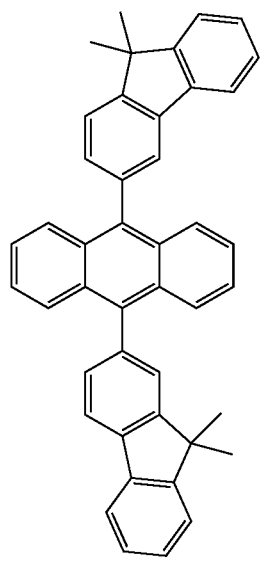
1-95
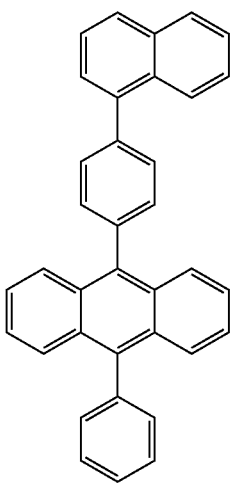
1-96
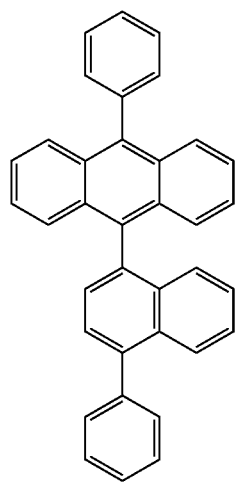
1-97
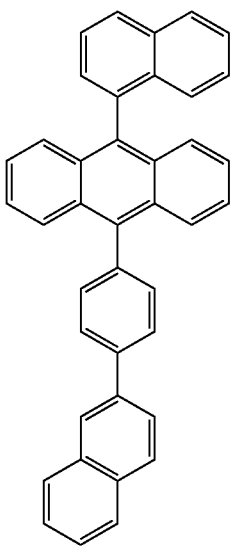

1-98
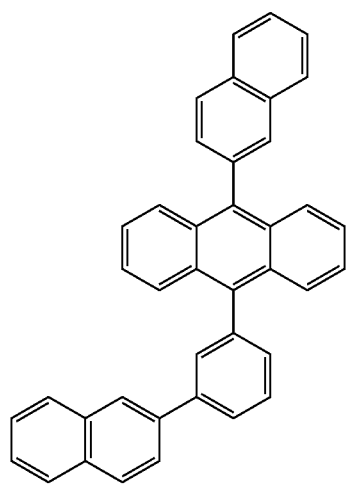
1-99
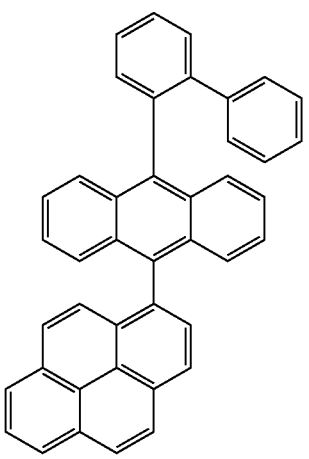
1-100
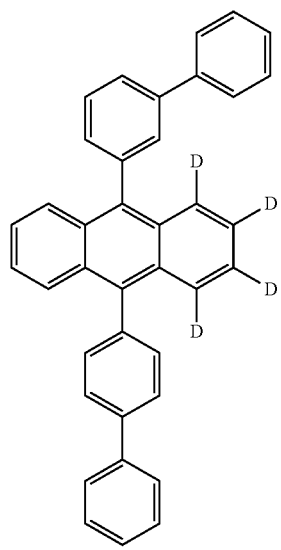
1-101
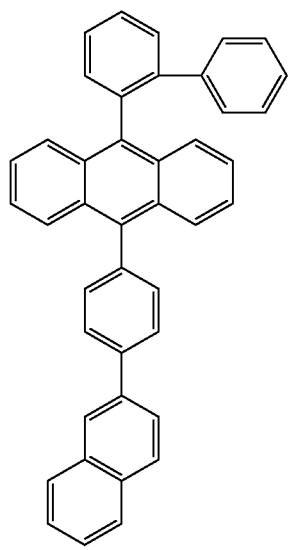
1-102
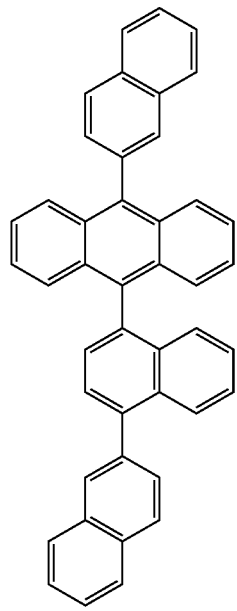
1-103
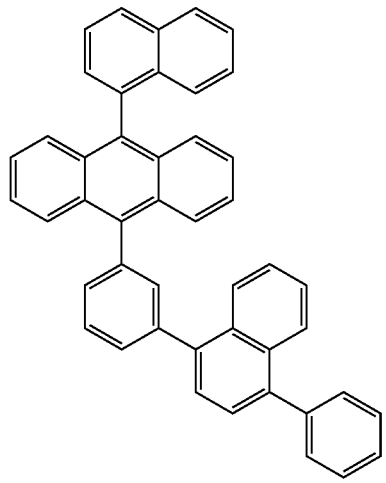

1-104
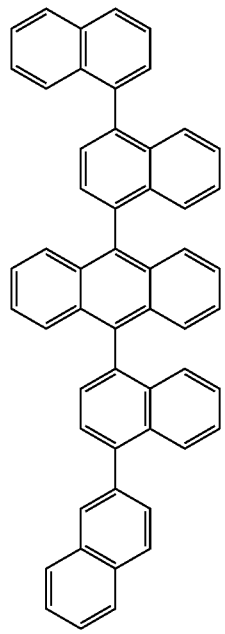
1-105
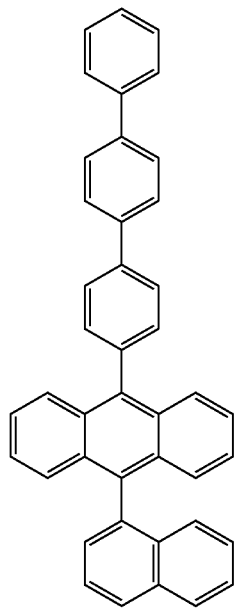
1-106
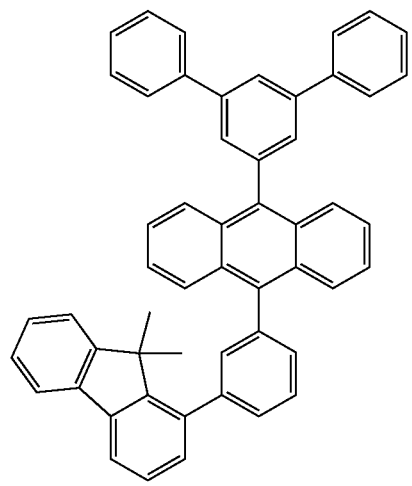
1-107
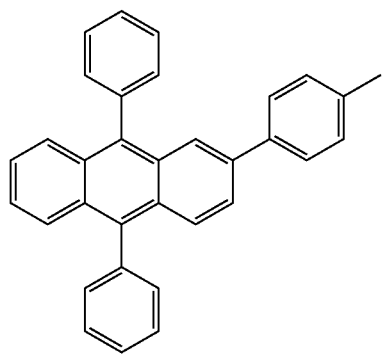
1-108
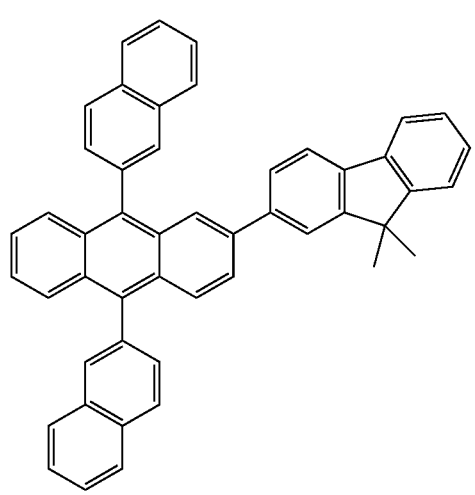
1-109
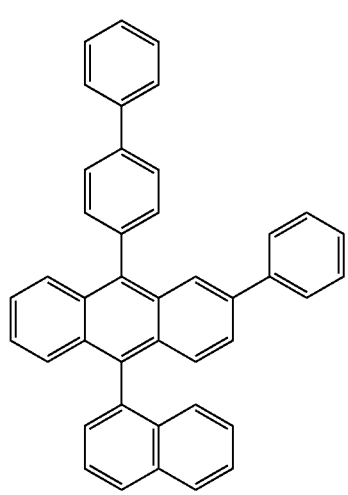

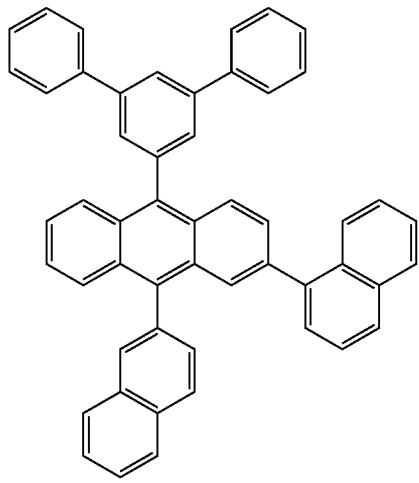

The first emission layer EML1 may further include a common material known in the art as the first light-emitting host material. For example, the first emission layer EML1 may include at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TcTa) and 1,3,5-tris(N-phenylbenzimidazole-2-yl)benzene (TPBi). For example, tris(8-hydroxyquinolino)aluminum (Alq$_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO$_3$), octaphenylcyclotetra siloxane (DPSiO$_4$), 2,8-bis(diphenylphosphoryl)dibenzofuran (PPF), etc. may be used as the first light-emitting host material, but exemplary embodiments are not limited thereto.

The first light-emitting dopant may be a phosphorescence dopant, a fluorescence dopant, or a dopant for thermally activated delayed fluorescence. For example, the first light-emitting dopant may include at least one of N,N,N',N'-tetraphenyl-pyrene-1,6-diamine (TPD), 4,4'-bis(2-(9-ethyl-9H-carbazol-3-yl)vinyl)-1,1'-biphenyl; 4,4'-bis(9-ethyl-3-carbazovinylene)-1,1'-biphenyl (BCzVBi), 10-phenyl-10H,10'H-spiro[acridine-9,9'-anthracene]-10'-one (ACRSA), 10-phenyl-10H-spiro[acridine-9,9'-fluorene]-2',7'-dicarbonitrile (ACRFLCN), 3,4,5,6-Tetra-9H-carbazol-9-yl-1,2-benzenedicarbonitrile (4CzPN), 2,4,5,6-tetra-9H-carbazol-9-yl-isophthalonitrile (4CzIPN), bis[4-9,9-dimethyl-9,10-dihydroacridine)phenyl]sulfone (DMAC-DPS), 2-(biphenyl-4-yl)-4,6-bis(12-phenylindolo[2,3-a]cabazole-11-yl)-1,3,5-triazine (PIC-TRZ), 12-(4,6-diphenyl-1,3,5-triazin-2-yl)-5-phenyl-5,12-dihydroindolo[3,2-a]carbazole (PIC-TRZ2), 10-(4-(4,6-diphenyl-1,3,5-triazin-2-yl)phenyl)-10H-phenoxazine (PXZ-TRZ) and 2-phenoxazine-4,6-diphenyl-1,3,5-triazine (PSZ-TRZ).

Alternatively, the first light-emitting dopant may include a boron-containing dopant, for example, at least one of the following Compounds D-1 to D-13:

D-1

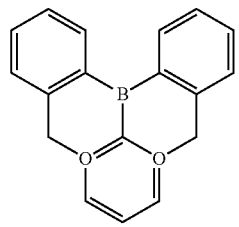

D-2

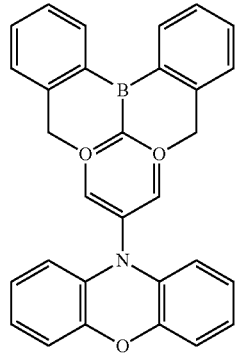

D-3

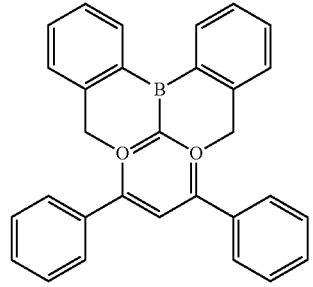

D-4
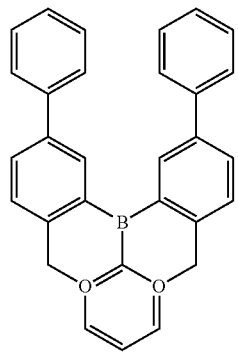
D-5
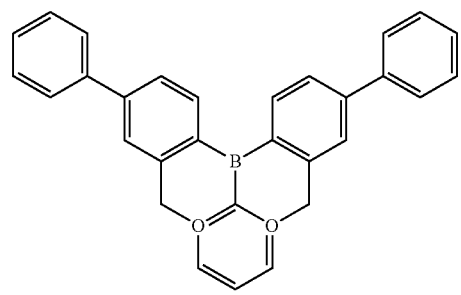
D-6
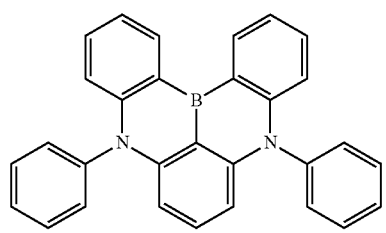
D-7
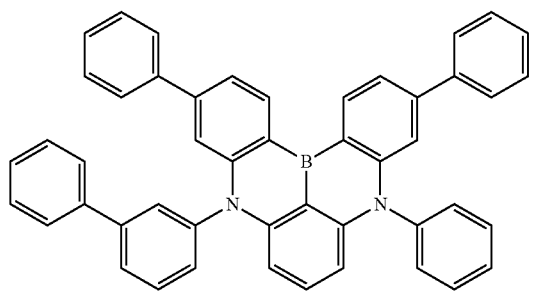
D-8
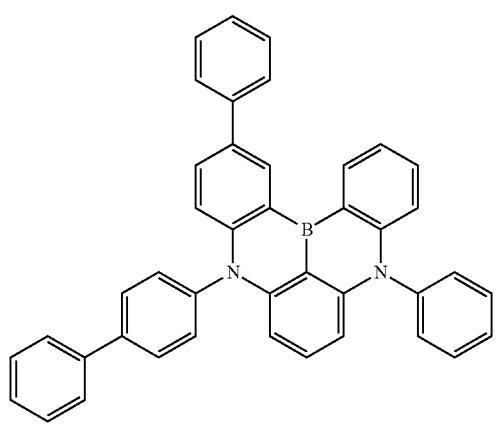
D-9
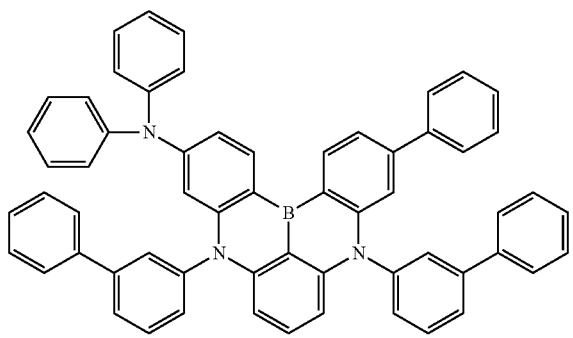
D-10
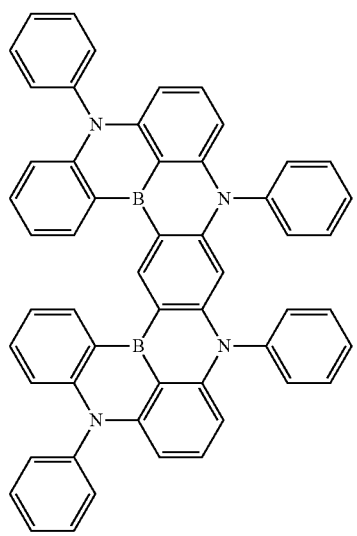
D-11
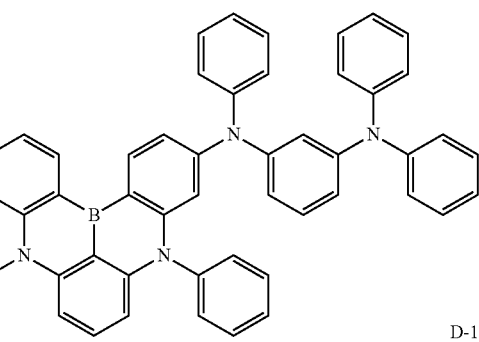
D-12
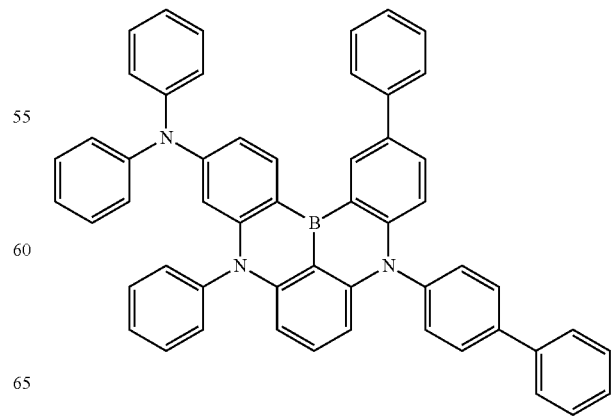

-continued

D-13

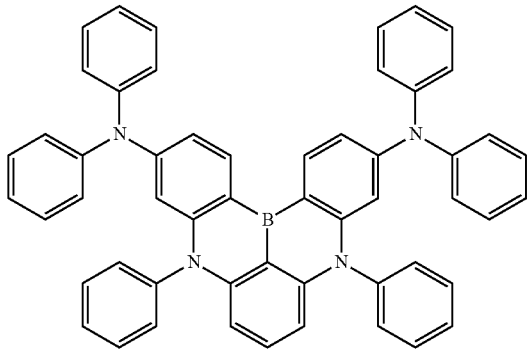

In addition, the first emission layer EML1 may include as known dopant materials, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino) styryl)naphthalen-2-yl)vinyl)phenyl)-N-phenylbenzenamine (N-BDAVBi), perylene and the derivatives thereof (for example, 2,5,8,11-tetra-t-butylperylene (TBP)), pyrene and the derivatives thereof (for example, 1,1-dipyrene, 1,4-dipyrenylbenzene, 1,4-bis(N,N-diphenylamino)pyrene), etc.

Referring to FIG. 4, in an exemplary embodiment, the first emission layer EML1 may include a first sub emission layer Sub-E1, a second sub emission layer Sub-E2 and a third sub emission layer Sub-E3.

The first sub emission layer Sub-E1 may be overlapped with a first pixel area PXA1, the second sub emission layer Sub-E2 may be overlapped with a second pixel area PXA2, and the third sub emission layer Sub-E3 may be overlapped with a third pixel area PXA3.

The first sub emission layer Sub-E1 may be a blue emission layer which emits light having a wavelength of about 410 nm to about 480 nm. The first sub emission layer Sub-E1 may include a first light-emitting host and a first light-emitting dopant.

The second sub emission layer Sub-E2 may be a green emission layer which emits light having a wavelength of about 500 nm to about 570 nm. The second sub emission layer Sub-E2 may include, for example, a fluorescence host material including tris(8-hydroxyquinolino)aluminum (Alq3), and may include a fluorescence dopant including, for example, a metal complex such as fac-tris(2-phenylpyridine) iridium (Ir(ppy)3), an organometallic complex, or coumarin derivatives.

The third sub emission layer Sub-E3 may be a red emission layer which emits light having a wavelength of about 625 nm to about 675 nm. The third sub emission layer Sub-E3 may include a fluorescence host material including, for example, tris(dibenzoylmethanoato)phenanthroline europium (PBD:Eu(DBM)$_3$(Phen)) or perylene, and may include a fluorescence dopant including, for example, a metal complex or an organometallic complex such as bis(1-phenylisoquinoline)acetylacetonate iridium (PIQIr(acac)), bis(1-phenylquinoline)acetylacetonate iridium (PQIr(acac)), tris(I-phenylquinoline)iridium (PQIr) and octaethylporphyrin platinum (PtOEP), rubrene derivatives, and 4-dicyanomethylene-2-(p-dimethylaminostyryl)-6-methyl-4H-pyrane (DCM) derivatives.

The second emission layer EML2 is disposed on the first emission layer EML1. Referring to FIG. 4, the second emission layer EML2 may be a common layer which is overlapped with the first pixel area to the third pixel area PXA1, PXA2 and PXA3.

The second emission layer EML2 may have a smaller thickness than the first emission layer EML1. The thickness of the second emission layer EML2 is not specifically limited as long as it satisfies the thickness ratio with respect to the first emission layer EML1, for example, the second emission layer EML2 may have a thickness of about 10 Å to about 400 Å, or from about 30 Å to about 300 Å. The second emission layer EML2 may be a single layer formed using a single material, or a single layer formed using a plurality of different materials, or may have a multilayer structure having a plurality of layers formed using a plurality of different materials.

The second emission layer EML2 may be an emission layer emitting blue light. The second emission layer EML2 may be a fluorescence emission layer. The second emission layer EML2 may include a fluorescence-emitting material or a phosphorescence-emitting material. The second emission layer EML2 may include a second light-emitting dopant. The second light-emitting dopant may be a fluorescence dopant. In an exemplary embodiment, the second light-emitting dopant may be a fluorescence dopant which emits blue light.

The material of the second light-emitting dopant is not specifically limited as long as it satisfies the relation of the triplet energy level according to an exemplary embodiment. For example, the second light-emitting dopant may include at least one of N,N,N',N'-tetraphenyl-pyrene-1,6-diamine (TPD), 4,4'-bis(2-(9-ethyl-9H-carbazol-3-yl)vinyl)-1,1'-biphenyl; 4,4'-bis(9-ethyl-3-carbazovinylene)-1,1'-biphenyl (BCzVBi), 10-phenyl-10H,10'H-spiro[acridine-9,9'-anthracene]-10'-one (ACRSA), 3,4,5,6-tetra-9H-carbazol-9-yl-1, 2-benzenedicarbonitrile (4CzPN), 2,4,5,6-tetra-9H-carbazol-9-yl-isophthalonitrile (4CzIPN), bis[4-9,9-dimethyl-9, 10-dihydroacridine)phenyl]sulfone (DMAC-DPS), and 2-phenoxazine-4,6-diphenyl-1,3,5-triazine (PSZ-TRZ). In addition, the second emission layer EML2 may include as known dopant materials, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino) styryl)naphthalen-2-yl)vinyl)phenyl)-N-phenylbenzenamine (N-BDAVBi), perylene and the derivatives thereof (for example, 2,5,8,11-tetra-t-butylperylene (TBP)), pyrene and the derivatives thereof (for example, 1,1-dipyrene, 1,4-dipyrenylbenzene, 1,4-bis(N,N-diphenylamino)pyrene), etc.

In an exemplary embodiment, the second light-emitting dopant may include the same material as the first light-emitting dopant.

In an exemplary embodiment, the second emission layer EML2 may further include a first electron transport material. The first electron transport material may be any materials that may perform electron transporting role, without specific limitation. For example, the first electron transport material may include tris(8-hydroxyquinolinato)aluminum (Alq$_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3, 5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), (3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl- 4-olato)aluminum (BAlq), berylliumbis(benzoquinolin-10-olate) (Bebq$_2$), 9,10-di(naphthalene-2-yl)anthracene (ADN), and a mixture thereof.

The electron transport region ETR is disposed on the second emission layer EML2. The electron transport region ETR may include at least one of a hole blocking layer, an electron transport layer ETL and an electron injection layer EIL, without limitation.

The electron transport region ETR may include at least one of the compounds selected from the formulae 2A, 2B, 2C, 2D, and 2E and the following formulae 3A and 3B. However, exemplary embodiments are not limited thereto.

<Formula 2A>

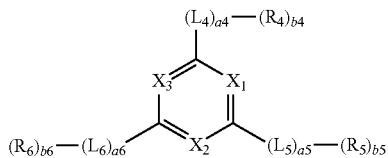

<Formula 2B>

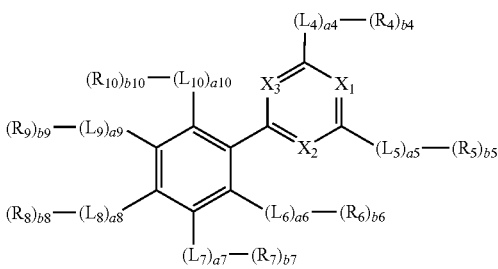

<Formula 2C>

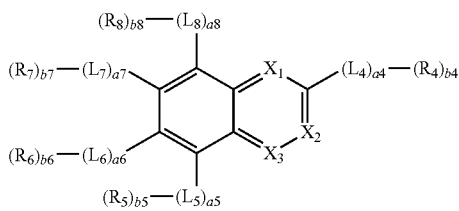

<Formula 2D>

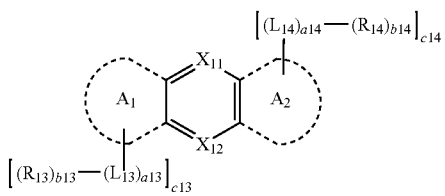

<Formula 2E>

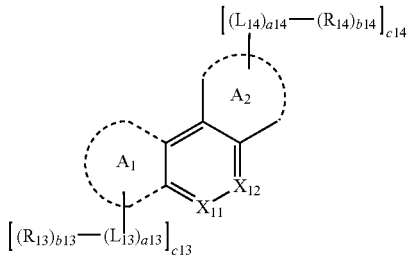

[Formula 3A]

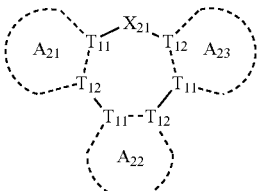

[Formula 3B]

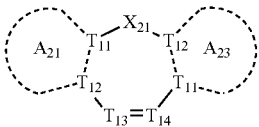

In Formulae 2D and 2E, rings $A_1$ and $A_2$ are each independently a $C_5$-$C_{60}$ carboxylic group or a $C_1$-$C_{30}$ heterocyclic group, rings $A_{21}$, $A_{22}$ and $A_{23}$ are each independently a $C_5$-$C_{60}$ carboxylic group or a $C_1$-$C_{30}$ heterocyclic group, which is substituted with at least one *-[$(L_{22})_{a22}$-$(R_{22})_{b22}$], $T_{11}$ and $T_{12}$ are each independently carbon or nitrogen, optional two or more among three $T_{11}$ groups of Formula 3A are the same or different, $T_{13}$ is N or C($R_{27}$), $T_{14}$ is N or C($R_{28}$), optional two or more among three $T_{12}$ groups of Formula 3A are the same or different, optional two or more among two $T_{11}$ groups of Formula 3B are the same or different, optional two or more among two $T_{12}$ groups of Formula 3B are the same or different, a bond between $T_{11}$ and $T_{12}$ is a single bond or a double bond, a case where all of three $T_{12}$ groups and three $T_{12}$ groups are nitrogen is excluded from Formula 3A, a case where all of two $T_{11}$ group, two $T_{12}$ groups, $T_{13}$ and $T_{14}$ are nitrogen is excluded from Formula 3B, rings $A_{21}$, $A_{22}$ and $A_{23}$ share $T_{11}$ and $T_{12}$, respectively, and are condensed with seven-member rings in Formulae 3A and 3B, $X_1$ is N or C-$(L_1)_{a1}$-$(R_1)_{b1}$, $X_2$ is N or C-$(L_2)_{a2}$-$(R_2)_{b2}$, $X_3$ is N or C-$(L_3)_{a3}$-$(R_3)_{c3}$, at least one of $X_1$, $X_2$, and $X_3$ is N, $X_{11}$ is N or C-$(L_{11})_{a11}$-$(R_{11})_{b11}$, $X_{12}$ is N or C-$(L_{12})_{a12}$-$(R_{12})_{b12}$, $X_{21}$ is selected from O, S, Se, C($R_{23}$)($R_{24}$), Si($R_{23}$)($R_{24}$) and N-[$(L_{21})_{a21}$-$(R_{21})_{b21}$], $L_1$ to $L_{14}$, $L_{21}$ and $L_{22}$ are each independently selected among a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heteroalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group and a substituted or unsubstituted divalent non-aromatic hetero condensed polycyclic group, a1 to a14, a21 and a22 are each independently selected from an integer of 0 to 5, $R_1$ to $R_{14}$, $R_{21}$ to $R_{24}$, $R_{27}$ and $R_{28}$ are each independently selected among hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthiol group, a substituted or unsubstituted $C_1$-$C_{60}$ heteroaryl group, a substituted or unsubstituted monovalent non-aromatic condensed polycyclic group, a substituted or unsubstituted monovalent non-aromatic hetero condensed polycyclic group, —Si($Q_1$)($Q_2$)($Q_3$), —N($Q_1$)($Q_2$), —B($Q_1$)($Q_2$), —C(=O)($Q_1$), —S(=O)$_2$($Q_1$) and —P(=O)($Q_1$)($Q_2$), b1 to b14, b21 and b22 are each independently selected from an integer of 0 to 4, c13 and c14 are each independently selected from an integer of 0 to 5, at least one of substituents of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic hetero condensed polycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthiol group, the substituted $C_1$-$C_{60}$ heteroaryl group, the substituted monovalent non-aromatic condensed polycyclic group and the substituted monovalent non-aromatic hetero condensed polycyclic group, is selected among deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group and a $C_1$-$C_{60}$ alkoxy group; a $C_1$-$C_{60}$ alkyl group, a $C_2$-$C_{60}$ alkenyl group, a $C_2$-$C_{60}$ alkynyl group and a $C_1$-$C_{60}$ alkoxy group, which are substituted with at least one selected among deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthiol group, a $C_1$-$C_{60}$ heteroaryl group, a monovalent non-aromatic condensed polycyclic group, a monovalent non-aromatic hetero condensed polycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$) and —P(=O)($Q_{11}$)($Q_{12}$); a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthiol group, a $C_1$-$C_{60}$ heteroaryl group, a monovalent non-aromatic condensed polycyclic group, a monovalent non-aromatic hetero condensed polycyclic group, a biphenyl group and a terphenyl group; a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthiol group, a $C_1$-$C_{60}$ heteroaryl group, a monovalent non-aromatic condensed polycyclic group, and a monovalent non-aromatic hetero condensed polycyclic group, which are substituted with at least one selected among deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthiol group, a $C_1$-$C_{60}$ heteroaryl group, a monovalent non-aromatic condensed polycyclic group, a monovalent non-aromatic hetero condensed polycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$) and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$) and —P(=O)($Q_{31}$)($Q_{32}$), $Q_1$ to $Q_3$, $Q_{11}$ to $Q_{13}$, $Q_{21}$ to $Q_{23}$ and $Q_{31}$ to $Q_{33}$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a terphenyl group, a $C_1$-$C_{60}$ heteroaryl group, a $C_1$-$C_{60}$ heteroaryl group substituted with a $C_1$-$C_{60}$ alkyl group, a $C_1$-$C_{60}$ heteroaryl group substituted with a $C_6$-$C_{60}$ aryl group, a monovalent non-aromatic condensed polycyclic group and a monovalent non-aromatic hetero condensed polycyclic group.

The electron transport region ETR may include at least one of the compounds selected among the compounds represented in the following Compound Group 2, but exemplary embodiments are not limited thereto:

[Compound Group 2]

2-1

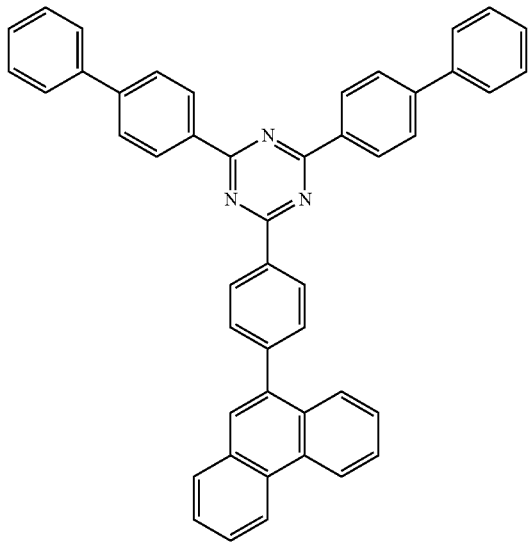

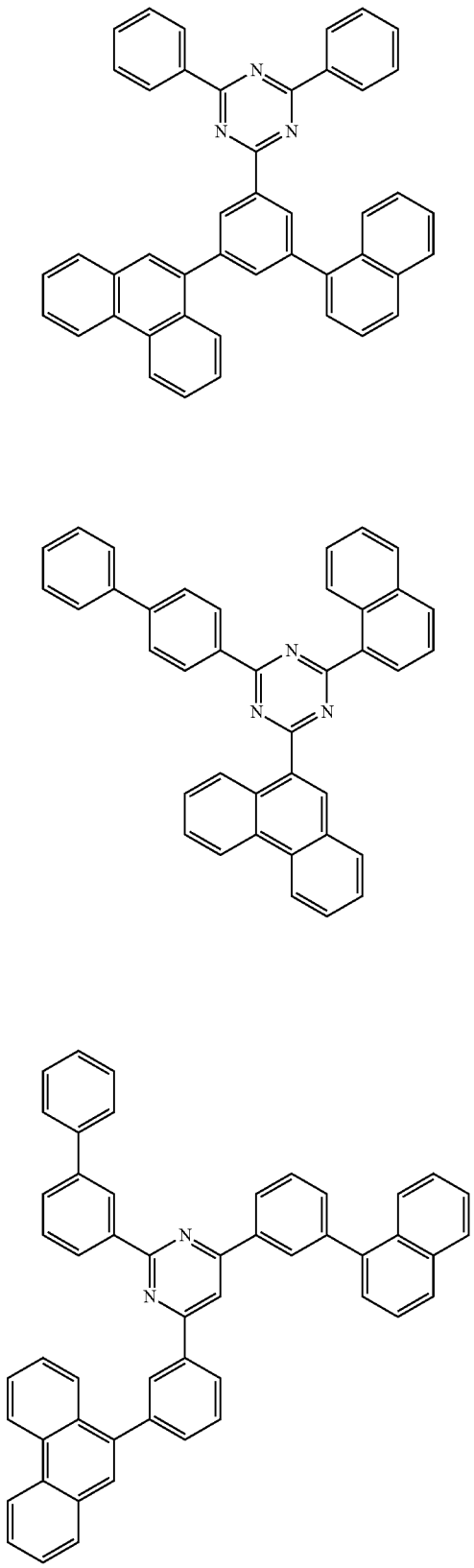
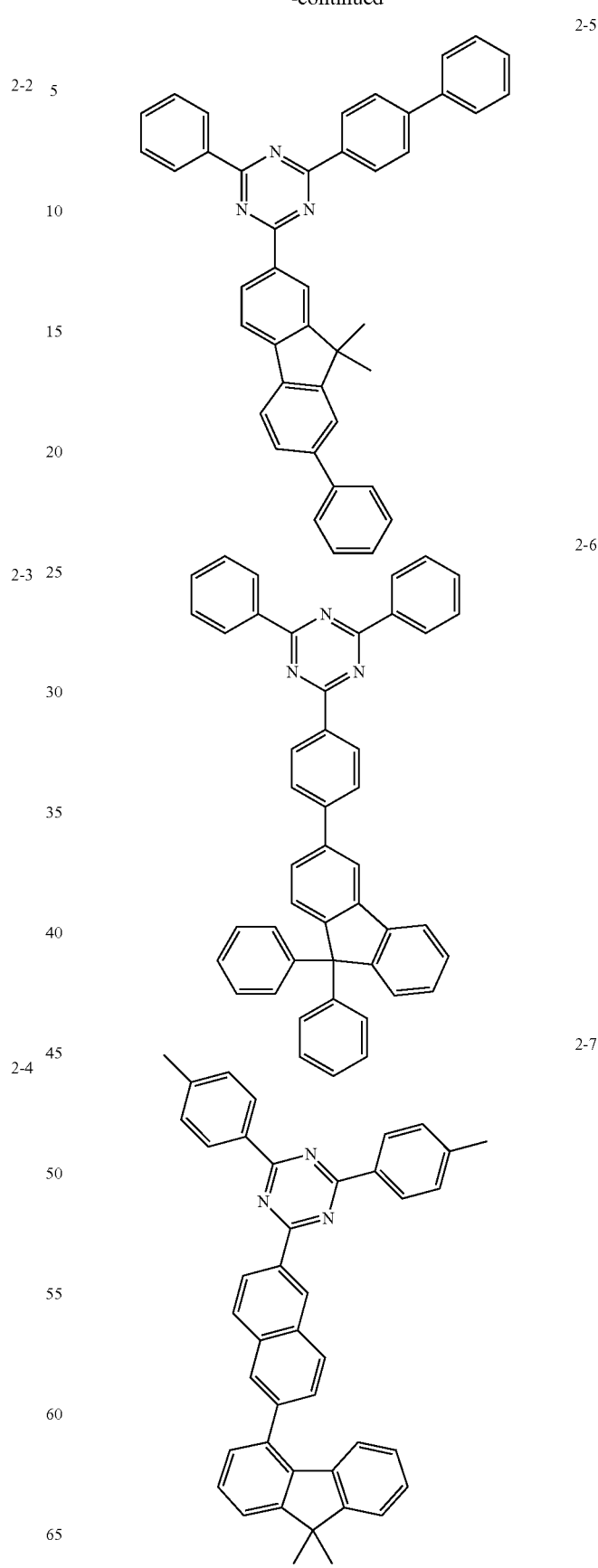

-continued
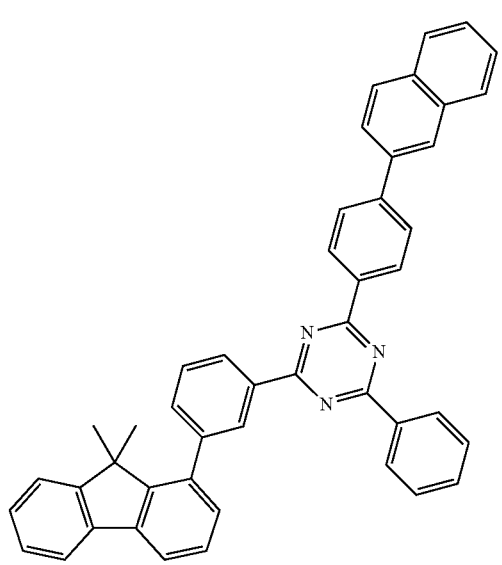
2-8
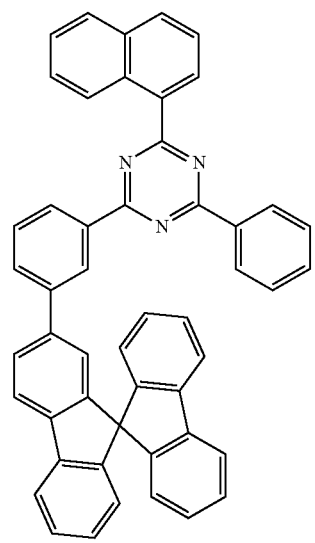
2-11
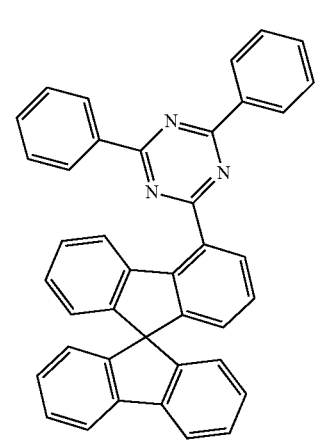
2-9
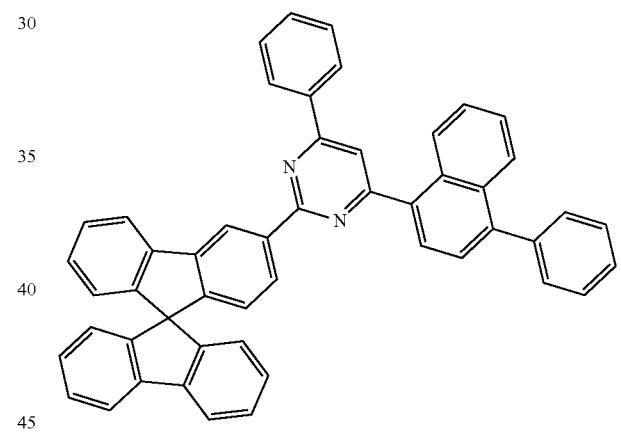
2-12
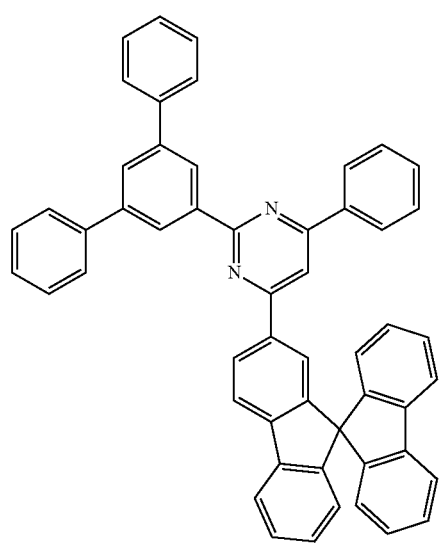
2-10
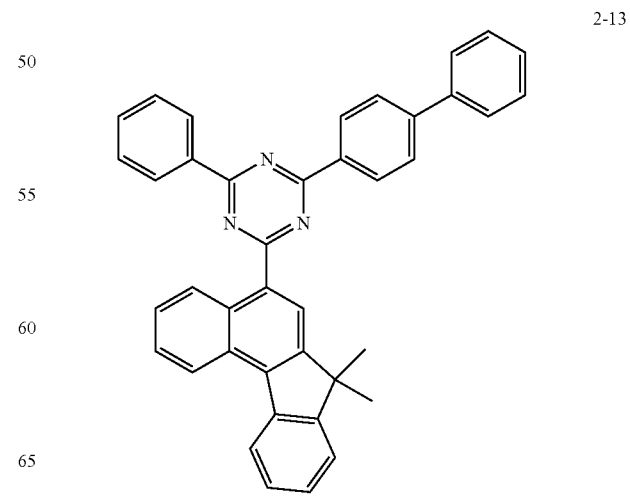
2-13

2-14
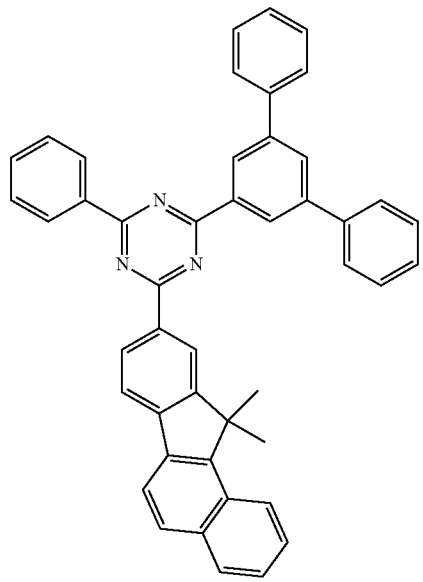
2-15
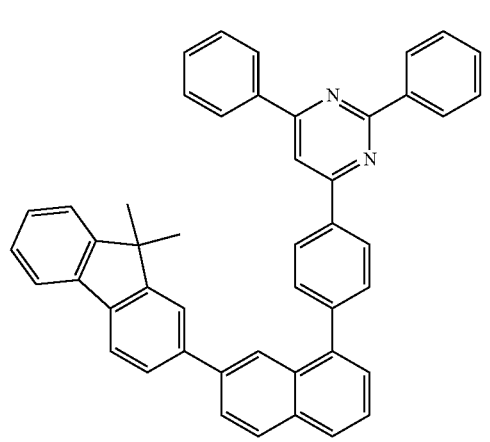
2-16
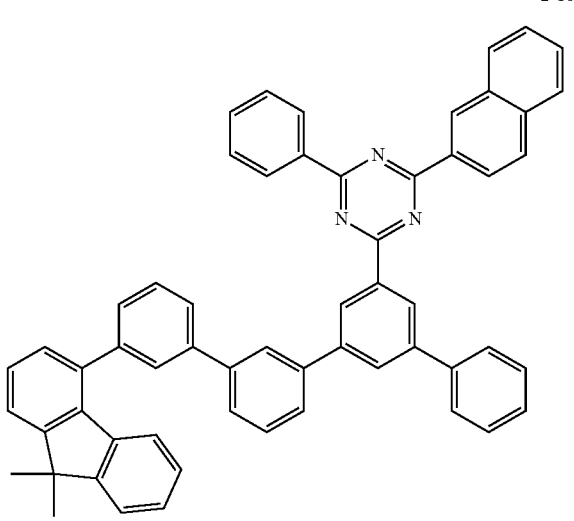
2-17
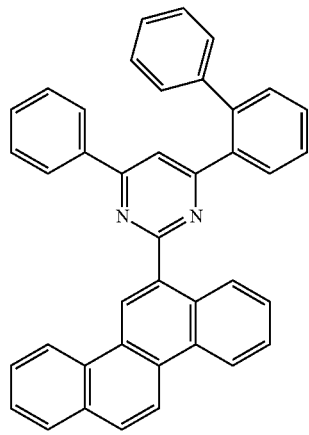
2-18
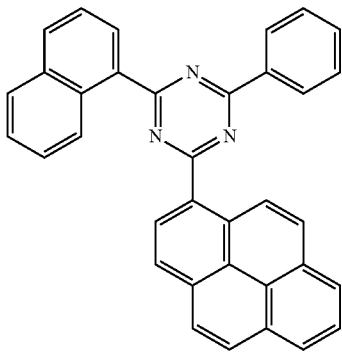
2-19
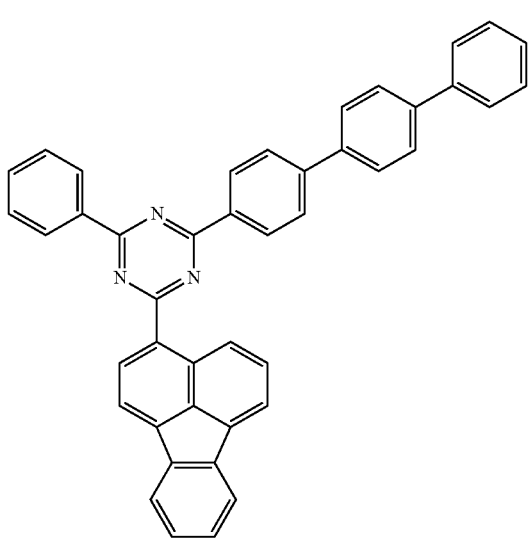

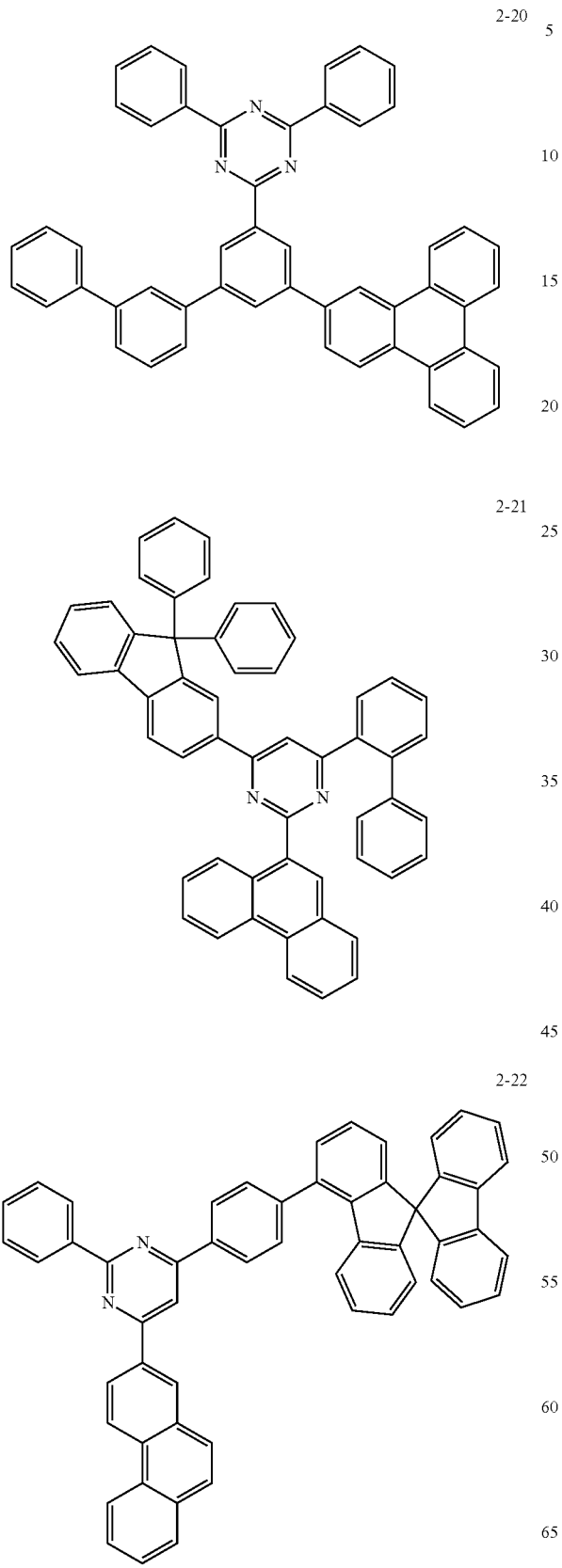
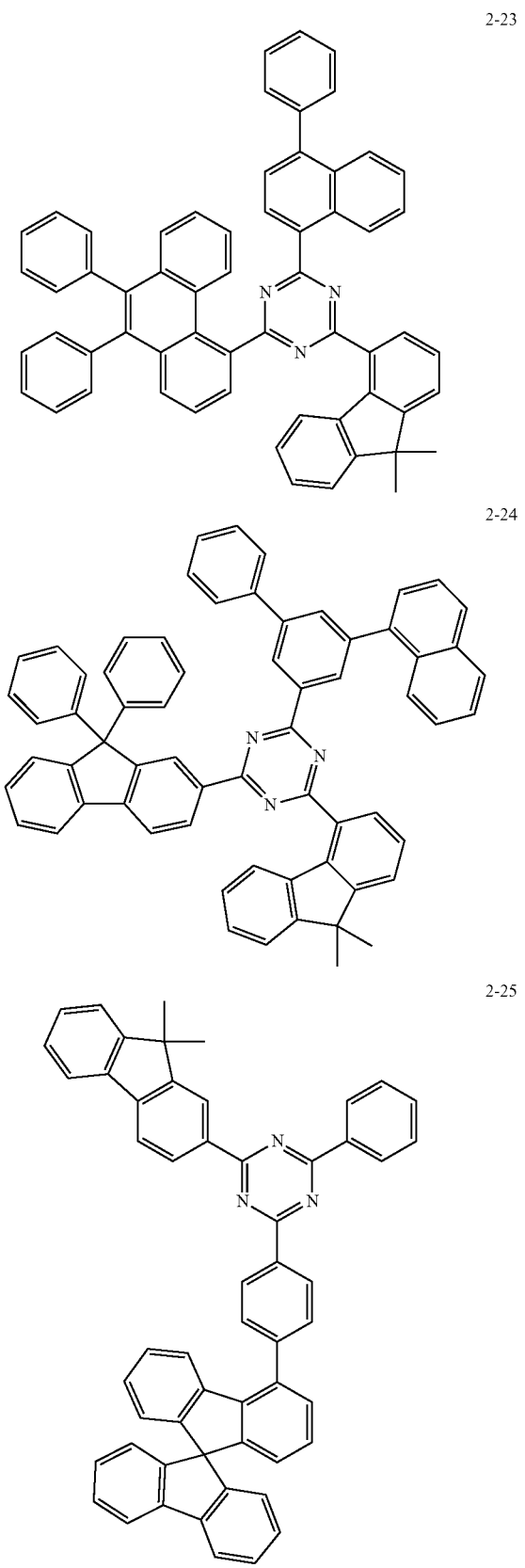

2-26
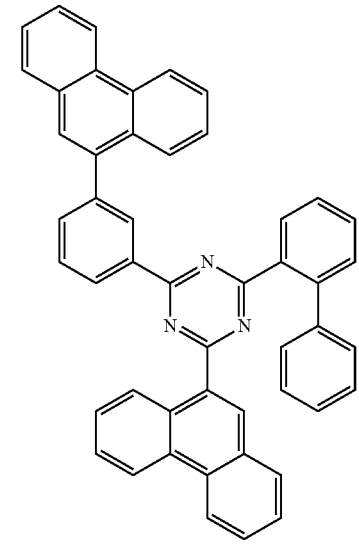
2-27
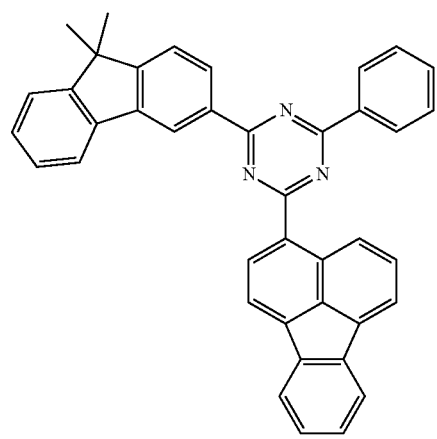
2-28
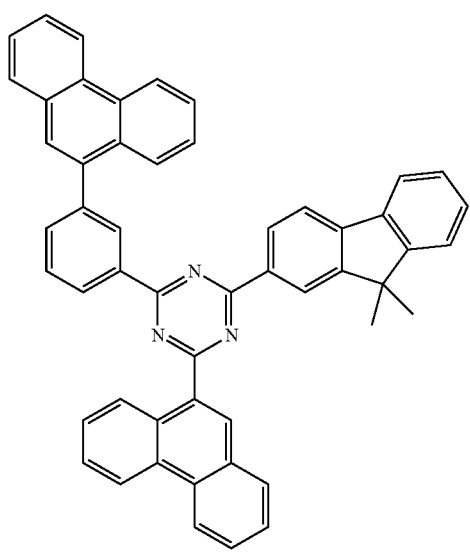
2-29
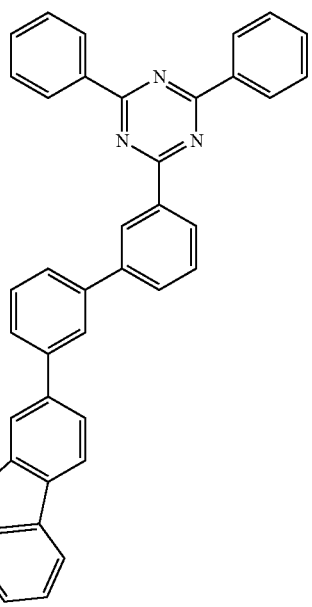
2-30
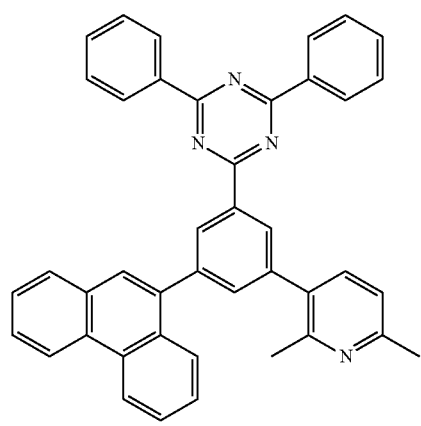
2-31
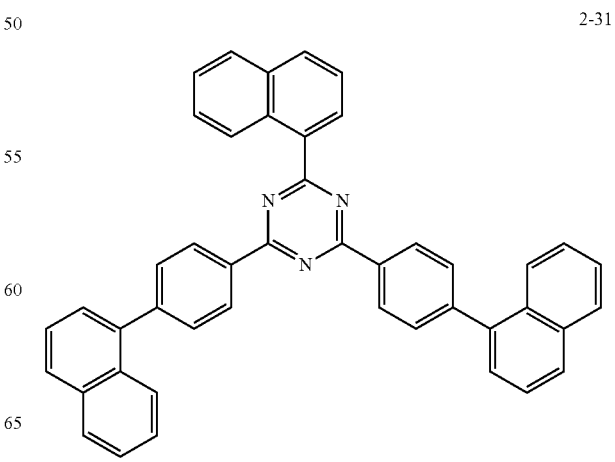

2-32
2-33
2-34
2-35
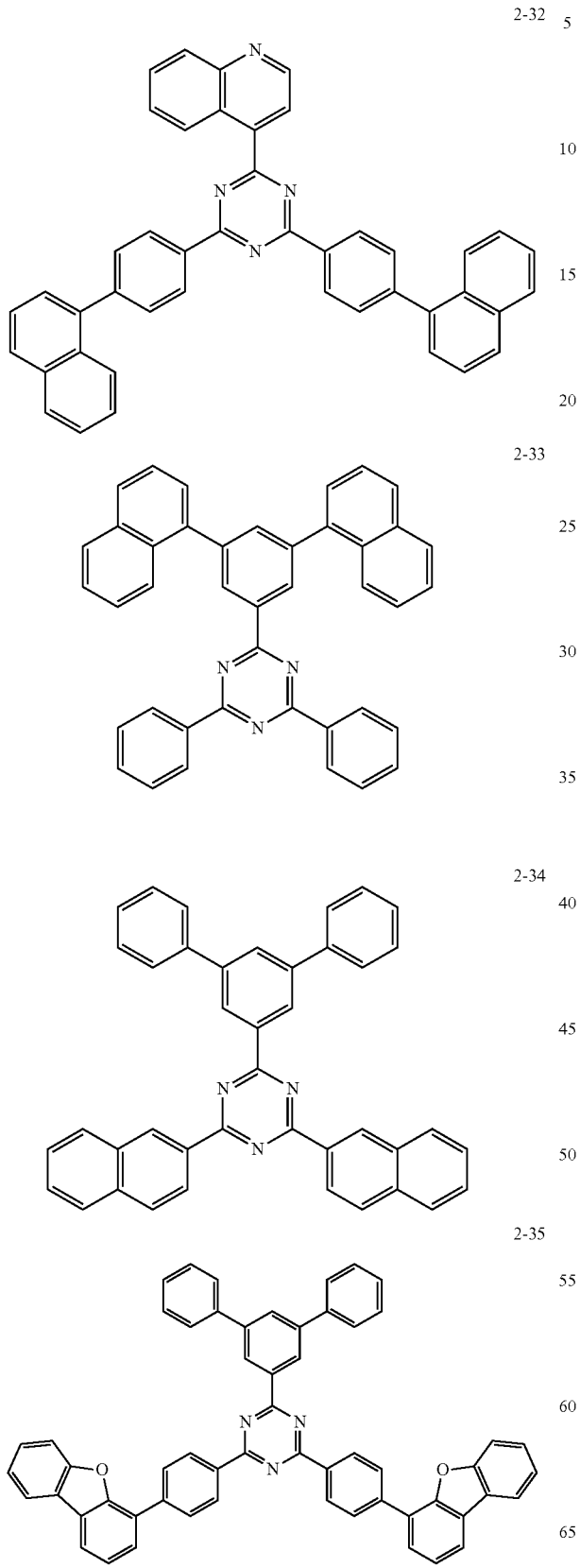
2-36
2-37
2-38
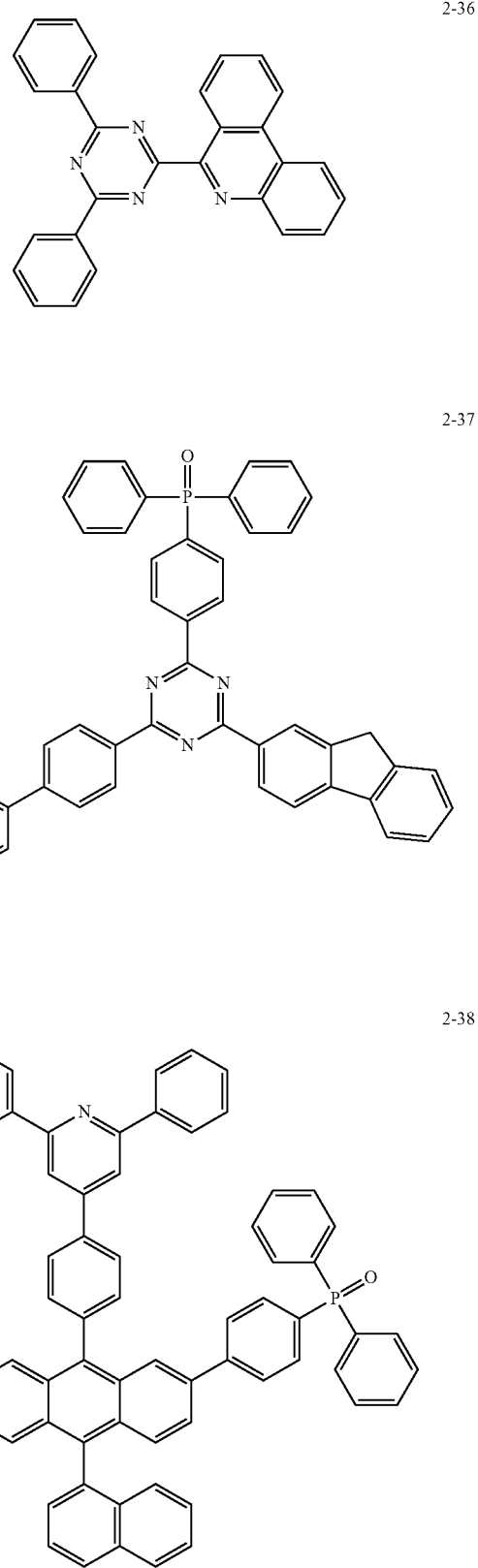

2-39
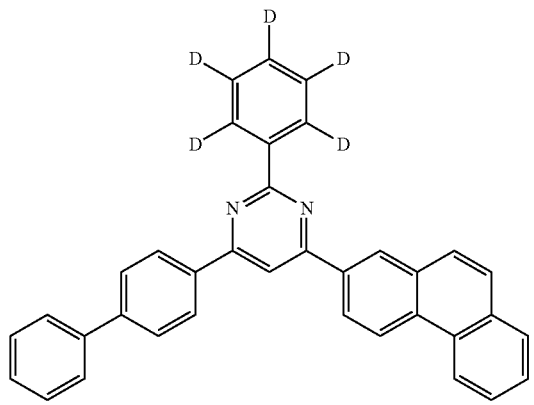
2-40
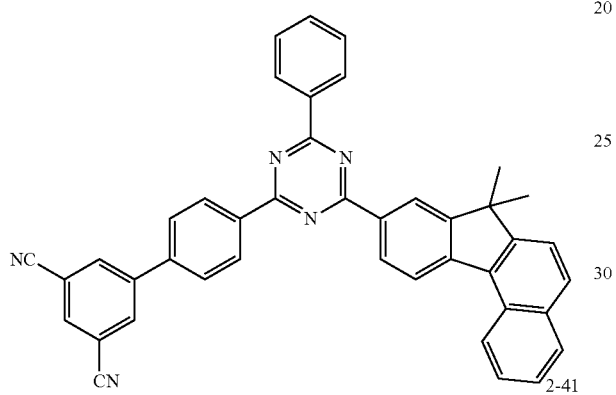
2-41
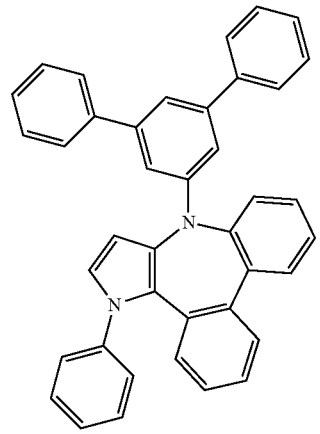
2-42
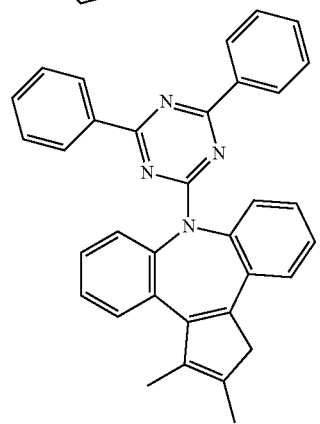
2-43
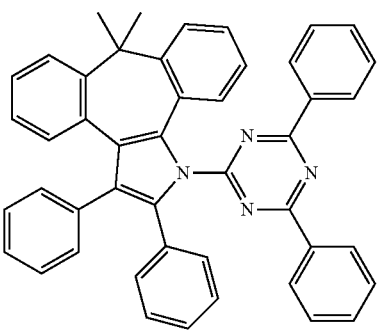
2-44
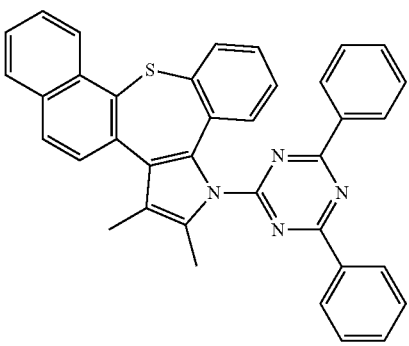
2-45
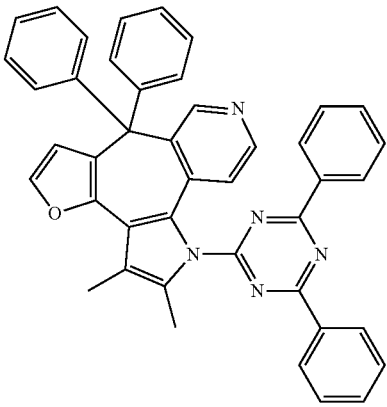
2-46
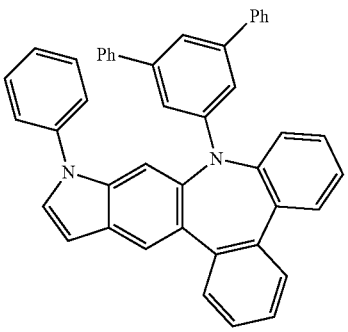

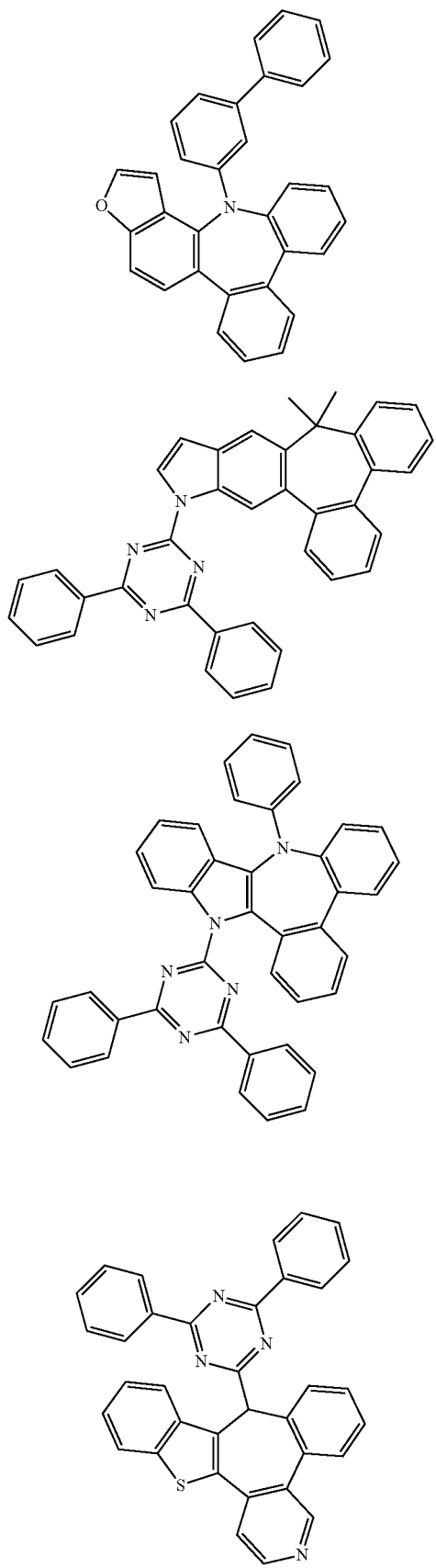
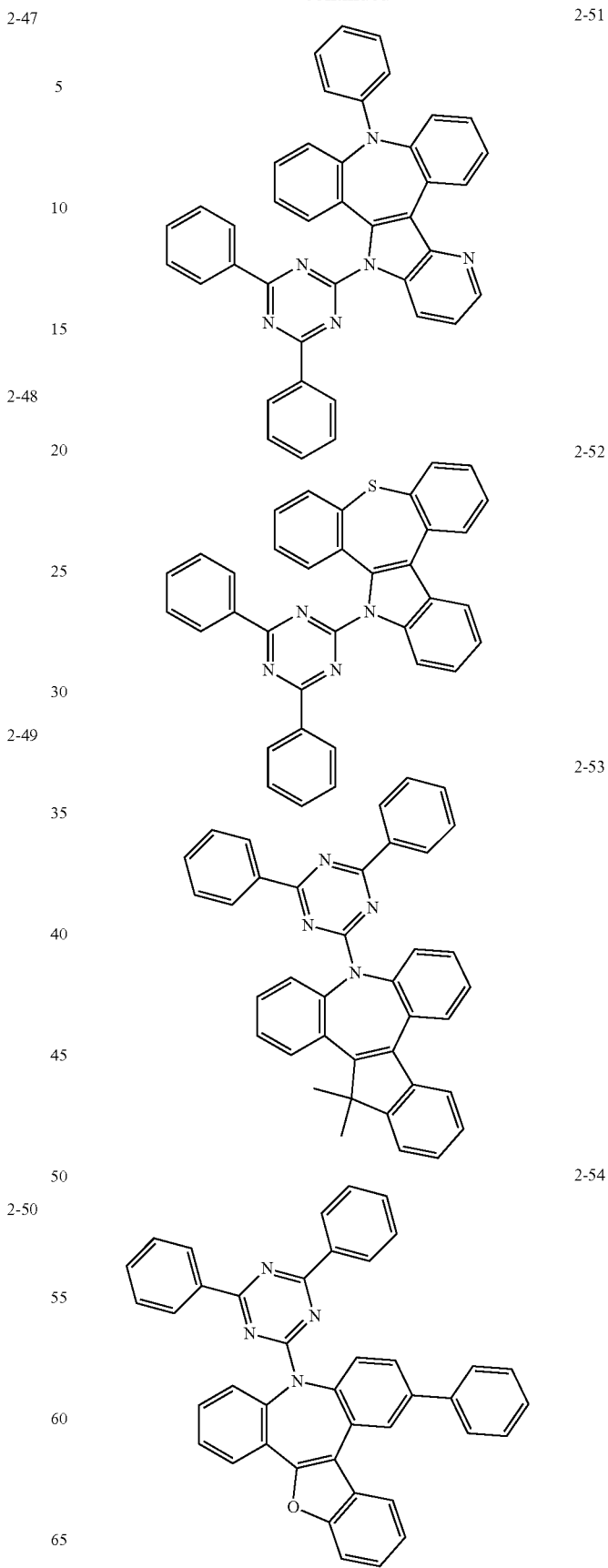

2-55 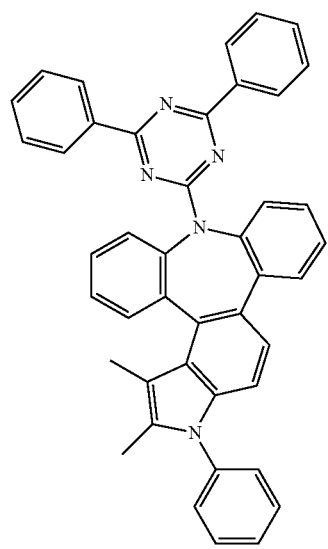
2-58 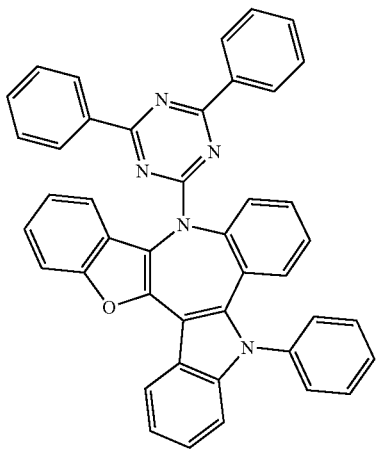
2-56 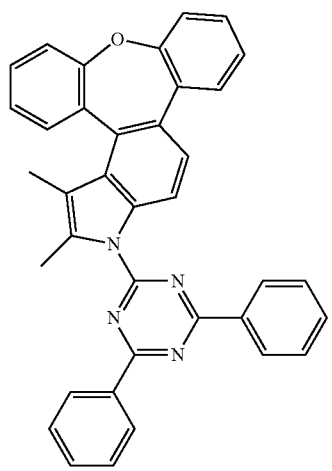
2-59 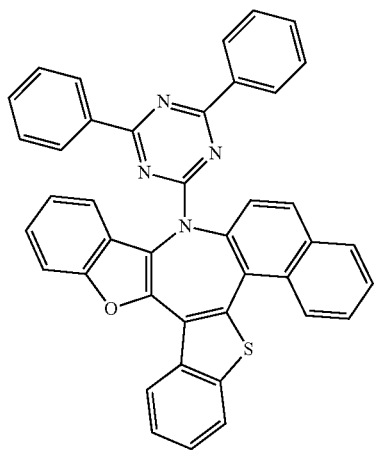
2-57 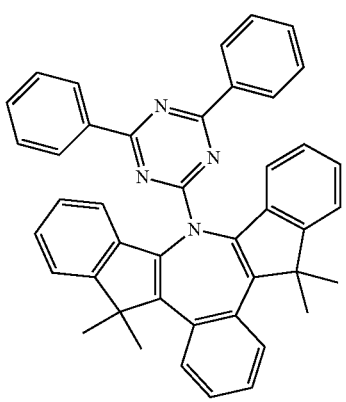
2-60 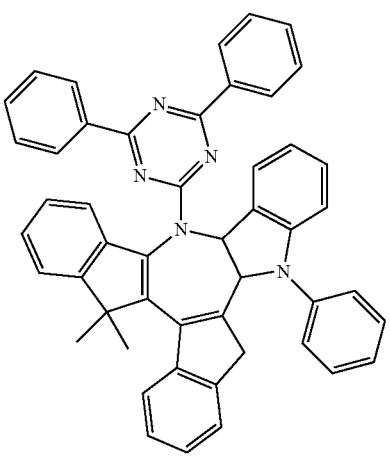

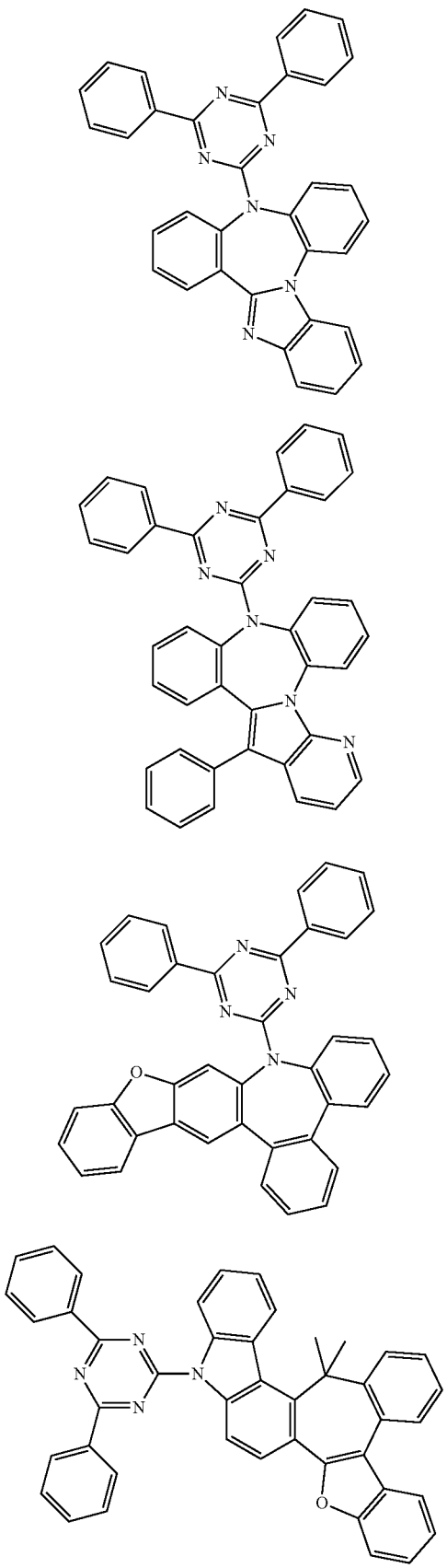
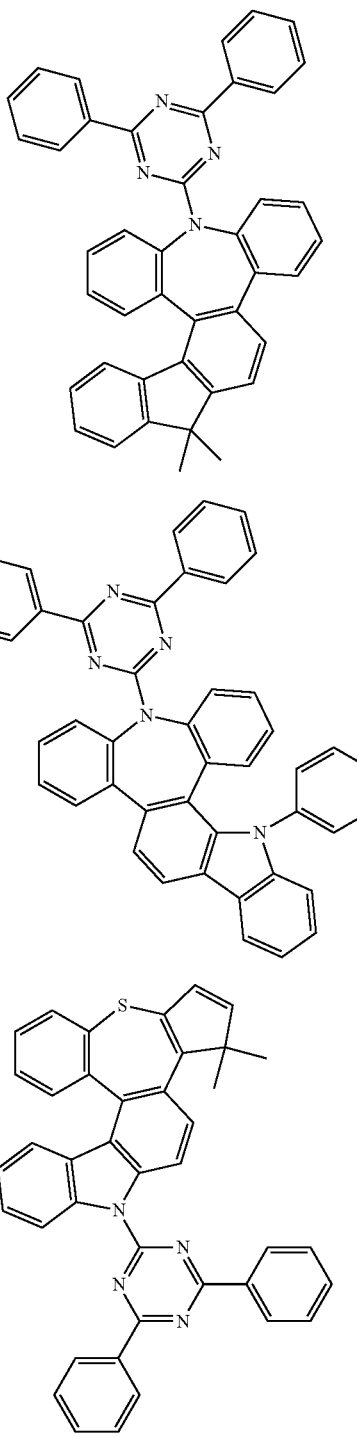
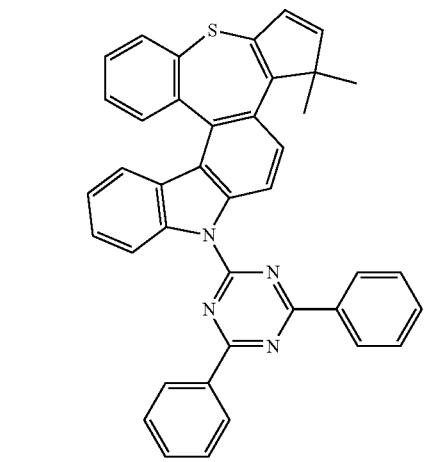

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method. The thickness of the electron transport region ETR may be, for example, from about 1,000 Å to about 1,500 Å.

In an exemplary embodiment, the electron transport region ETR may include the second electron transport material. The second electron transport material is not specifically limited as long as it satisfies the relation of the triplet energy according to an exemplary embodiment of the present invention. For example, tris(8-hydroxyquinolinato) aluminum (Alq$_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-Tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq$_2$), 9,10-di(naphthalene-2-yl)anthracene (ADN), and a mixture thereof may be included.

In an exemplary embodiment, the second electron transport material may be the same as or different from the first electron transport material.

The electron transport region ETR may have a single layer formed using a single material, a single layer formed using a plurality of different materials, or a multilayer structure including a plurality of layers formed using a plurality of different materials. For example, the electron transport region ETR may have the structure of a single layer such as an electron injection layer EIL and an electron transport layer ETL, or a single layer structure formed using an electron injection material and an electron transport material.

Referring to FIGS. 5 and 6, the electron transport region ETR may include a plurality of organic layers. Referring to FIG. 5, the electron transport region ETR may include electron transport layer ETL/electron injection layer EIL, stacked one by one from the second emission layer EML. Referring to FIG. 6, the electron transport region ETR may have a structure of buffer layer BFL/electron transport layer ETL/electron injection layer EIL, stacked one by one from the second emission layer EML. However, exemplary embodiments are not limited thereto.

If the electron transport region ETR includes a plurality of organic layers, an organic layer adjacent to the second emission layer may include the second electron transport material. For example, in FIG. 6, the buffer layer BFL adjacent to the second emission layer EML2 may include the above-described second electron transport material.

The thickness of the electron transport region ETR may be from about 100 Å to about 1,000 Å, for example, from about 100 Å to about 500 Å. If the thickness of the electron transport region ETR satisfies the above-described range, satisfactory electron transport properties may be obtained without substantial increase of a driving voltage.

If the electron transport region ETR includes the electron injection layer EIL, the electron transport region ETR may include LiF, lithium quinolate (LiQ), Li$_2$O, BaO, NaCl, CsF, a metal in lanthanoides such as Yb, or a metal halide such as RbCl, and RbI. However, exemplary embodiments are not limited thereto. The electron injection layer EIL also may be formed using a mixture material of the second electron transport material and an insulating organo metal salt. The organo metal salt may be a material having an energy band gap of about 4 eV or more. Particularly, the organo metal salt may include, for example, metal acetates, metal benzoates, metal acetoacetates, metal acetylacetonates, or metal stearates. The thickness of the electron injection layer EIL may be from about 1 Å to about 100 Å, and from about 3 Å to about 90 Å. If the thickness of the electron injection layer EIL satisfies the above described range, satisfactory electron injection properties may be obtained without inducing substantial increase of a driving voltage.

The electron transport region ETR may further include a hole blocking layer. The hole blocking layer may include, for example, at least one of 2,9-dimethyl-4,7-diphenyl-1,10-phenanthroline (BCP), or 4,7-diphenyl-1,10-phenanthroline (Bphen). However, exemplary embodiments are not limited thereto.

The second electrode EL2 is disposed on the electron transport region ETR. The second electrode EL2 may be a common electrode or a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Alternatively, the second electrode EL2 may have a multilayered structure including a reflective layer or a transflective layer formed using the above-described materials and a transparent conductive layer formed using ITO, IZO, ZnO, ITZO, etc.

Though not shown, the second electrode EL2 may be connected with an auxiliary electrode. If the second electrode EL2 is connected with the auxiliary electrode, the resistance of the second electrode EL2 may decrease.

In the organic electroluminescence device 10, according to the application of a voltage to each of the first electrode EL1 and second electrode EL2, holes injected from the first electrode EL1 may move via the hole transport region HTR to the first emission layer EML1, and electrons injected from the second electrode EL2 may move via the electron transport region ETR to the first emission layer EML1. The electrons and the holes are recombined in the first emission layer EML1 to produce excitons, and the excitons may emit light via transition from an excited state to a ground state.

If the organic electroluminescence device 10 is a top emission type, the first electrode EL1 may be a reflective electrode and the second electrode EL2 may be a transmissive electrode or a transflective electrode. If the organic electroluminescence device 10 is a bottom emission type, the first electrode EL1 may be a transmissive electrode or a transflective electrode and the second electrode EL2 may be a reflective electrode.

Hereinafter, the inventive concepts will be explained more particularly referring to embodiments and comparative embodiments. The exemplary embodiments below are only for illustration to assist the understanding of the inventive concepts, and the scope of the inventive concepts are not limited thereto.

(Device manufacturing example 1) An organic electroluminescence device of Example 1 was manufactured using materials in Table 1 by the method described below.

An ITO glass substrate (product of Corning Co.) on which an ITO layer with a thickness of about 1,200 Å was cut to a size of about 50 mm×50 mm×0.5 mm, washed by means of ultrasonic wave using isopropyl alcohol and pure water for about 15 minutes, respectively, exposed to ultraviolet rays for about 30 minutes, and washed by exposing to ozone, and then, the ITO glass substrate was installed in a vacuum deposition apparatus.

On the substrate, a known compound, m-MTDATA was deposited in vacuum to a thickness of about 600 Å to form a hole injection layer, and then, NPB was deposited in vacuum to a thickness of about 100 Å to form a hole transport layer.

On the hole transport layer, a first light-emitting host and a first light-emitting dopant were deposited in a weight ratio of about 97:3 at the same time to a thickness of about 300 Å to form a first emission layer.

On the first emission layer, a first electron transport material and a second light-emitting dopant were deposited in a weight ratio of about 97:3 at the same time to a thickness of about 100 Å to form a second emission layer.

Then, on the second emission layer, a second electron transport material was deposited to a thickness of about 200 Å as an electron transport layer, and on the electron transport layer, LiF which was a halogenated alkali metal was deposited to a thickness of about 10 Å as an electron injection layer, and Al was deposited in vacuum to a thickness of about 2,000 Å (second electrode) to form a LiF/Al electrode, and thus, an organic electroluminescence device was manufactured.

(Device manufacturing example 2) An organic electroluminescence device of Comparative Example 1 was manufactured using materials in Table 1 by the method described below.

An ITO glass substrate (product of Corning Co.) on which an ITO layer with a thickness of about 1,200 Å was cut to a size of about 50 mm×50 mm×0.5 mm, washed by means of ultrasonic wave using isopropyl alcohol and pure water for about 15 minutes, respectively, exposed to ultraviolet rays for about 30 minutes, and washed by exposing to ozone, and then, the ITO glass substrate was installed in a vacuum deposition apparatus.

On the substrate, a known compound, m-MTDATA was deposited in vacuum to a thickness of about 600 Å to form a hole injection layer, and then, NPB was deposited in vacuum to a thickness of about 100 Å to form a hole transport layer.

On the hole transport layer, a first light-emitting host and a first light-emitting dopant were deposited in a weight ratio of about 97:3 at the same time to a thickness of about 300 Å to form a first emission layer.

Then, on the first emission layer, a second electron transport material was deposited to a thickness of about 200 Å as an electron transport layer, and on the electron transport layer, LiF which was a halogenated alkali metal was deposited to a thickness of about 10 Å as an electron injection layer, and Al was deposited in vacuum to a thickness of about 2,000 Å (second electrode) to form a LiF/Al electrode, and thus, an organic electroluminescence device was manufactured.

[Device Manufacturing Materials]

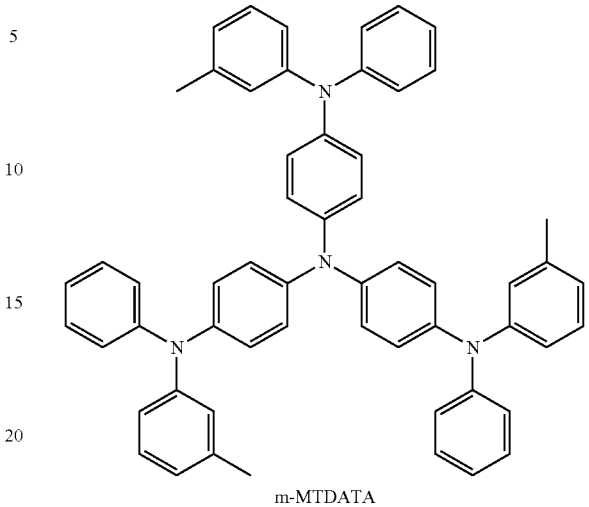

m-MTDATA

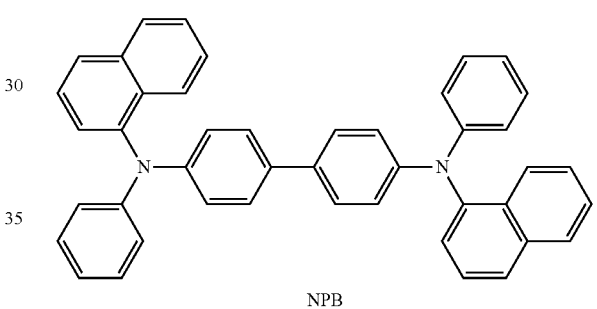

NPB

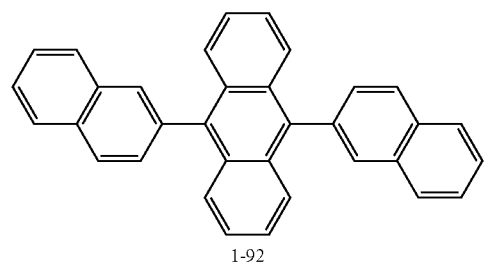

1-92

TABLE 1

| Device manufacturing example | First light-emitting host | First light-emitting dopant | Second light-emitting dopant | First electron transport material | Second electron transport material |
| --- | --- | --- | --- | --- | --- |
| Example 1 | 1-92 | $N^1,N^1,N^6,N^6$-tetraphenylpyrene-1,6-diamine | $N^1,N^1,N^6,N^6$-tetraphenylpyrene-1,6-diamine | Balq | Alq$_3$ |
| Comparative Example 1 | Balq | $N^1,N^1,N^6,N^6$-tetraphenylpyrene-1,6-diamine | — | — | Alq$_3$ |

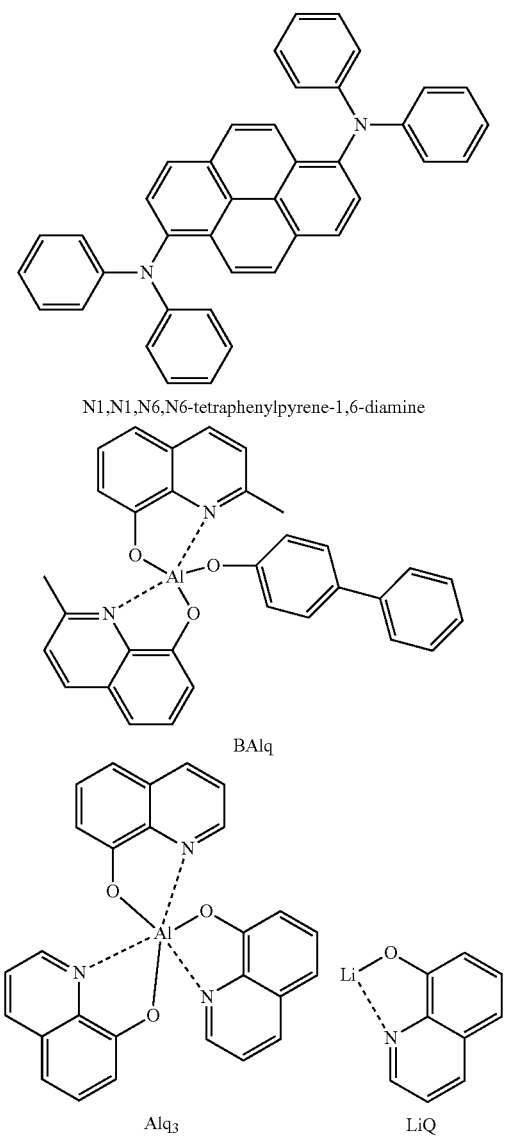

The driving voltage, efficiency and half life of the organic electroluminescence devices of Example 1 and Comparative Example 1 are listed in Table 2 below.

TABLE 2

| Device manufacturing example | First light-emitting host T1 (eV) | Second light-emitting dopant T1 (eV) | Second electron transport material T1 (eV) | Voltage (V) | Efficiency (cd/A) |
|---|---|---|---|---|---|
| Example 1 | 1.7 | 2.2 | 2.82 | 4.6 | 5.5 |
| Comparative Example 1 | 1.7 | — | 2.82 | 4.7 | 4.3 |

Referring to the results of Table 2, it was confirmed that the driving voltage was decreased and the efficiency was improved in Example 1 when compared with Comparative Example 1. The organic electroluminescence device of Example 1 includes a first emission layer, a second emission layer and an electron transport region in order, and the triplet energy of the first light-emitting host ($T1_a$), the triplet energy of the second light-emitting dopant ($T1_b$) and the triplet energy of the second electron transport material ($T1_c$) satisfy a relation of $T1_a < T1_b < T1_c$. Accordingly, the diffusion of the triplet excitons to a layer other than the first emission layer EML1 may be prevented or suppressed, and the triplet excitons restricted in the first emission layer EML1 are changed into singlet excitons via collision fusion, and thus, the emission efficiency of a device is increased.

The organic electroluminescence device of Comparative Example 1 did not include a second emission layer, and the triplet excitons of the first emission layer EML1 may be easily diffused into an electron transport region. Accordingly, it may be confirmed that the emission efficiency of a device is decreased when compared with the Example.

The organic electroluminescence device according to an exemplary embodiment includes a first emission layer including a first light-emitting host and a first light-emitting dopant, an electron transport region including a second electron transport material, and a second emission layer disposed between the first emission layer and the electron transport region and including a first electron transport material and a second light-emitting dopant, and excellent efficiency of a device was accomplished by controlling the triplet energy of the first light-emitting host ($T1_a$), the triplet energy of the second light-emitting dopant ($T1_b$) and the triplet energy of the second electron transport material ($T1_c$) to a relation of $T1_a < T1_b < T1_c$.

The organic electroluminescence device according to an exemplary embodiment has excellent efficiency.

The organic electroluminescence device according to an exemplary embodiment has long life.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic electroluminescence device, comprising:
   a first electrode;
   a hole transport region disposed on the first electrode;
   a first emission layer disposed on the hole transport region, the first emission layer comprising a first light-emitting host and a first light-emitting dopant;
   a second emission layer disposed on the first emission layer, the second emission layer comprising a first electron transport material and a second light-emitting dopant;
   an electron transport region disposed on the second emission layer, the electron transport region comprising a second electron transport material; and
   a second electrode disposed on the electron transport region,
   wherein a triplet energy of the first light-emitting host ($T1_a$), a triplet energy of the second light-emitting dopant ($T1_b$) and a triplet energy of the second electron transport material ($T1_c$) satisfy a relation of $T1_a < T1_b < T1_c$, and
   wherein the first electron transport material of the second emission layer and the second electron transport material of the electron transport region are a same material.

2. The organic electroluminescence device of claim 1, wherein a difference between the triplet energy of the second light-emitting dopant and the triplet energy of the first light-emitting host ($T1_b-T1_a$) is equal to or greater than about 0.3 eV.

3. The organic electroluminescence device of claim 1, wherein a difference between the triplet energy of the second electron transport material and the triplet energy of the second light-emitting dopant ($T1_c-T1_b$) is equal to or great than about 0.4 eV.

4. The organic electroluminescence device of claim 1, wherein the triplet energy of the first light-emitting host ($T1_a$) is equal to or greater than about 1.3 eV and equal to or less than about 2.0 eV.

5. The organic electroluminescence device of claim 1, wherein the triplet energy of the second light-emitting dopant ($T1_b$) is equal to or greater than about 1.7 eV and equal to or less than about 2.8 eV.

6. The organic electroluminescence device of claim 1, wherein the triplet energy of the second electron transport material ($T1_c$) is equal to or greater than about 2.2 eV and equal to or less than about 3.3 eV.

7. The organic electroluminescence device of claim 1, wherein the first light-emitting dopant is doped in the first light-emitting host,
wherein the second light-emitting dopant is doped in the first electron transport material, and
wherein a doping ratio of the first light-emitting dopant is less than or equal to a doping ratio of the second light-emitting dopant.

8. The organic electroluminescence device of claim 1, wherein the electron transport region comprises a plurality of organic layers, and
an organic layer adjacent to the second emission layer among the organic layers comprises the second electron transport material.

9. The organic electroluminescence device of claim 1, wherein the electron transport region comprises:
a buffer layer disposed on the second emission layer;
an electron transport layer disposed on the buffer layer; and
an electron injection layer disposed on the electron transport layer,
wherein the buffer layer comprises the second electron transport material.

10. The organic electroluminescence device of claim 1, wherein the first emission layer comprises a first sub emission layer, a second sub emission layer and a third sub emission layer, which are neighbored on a plane, and
the first sub emission layer comprises the first light-emitting host and the first light-emitting dopant.

11. The organic electroluminescence device of claim 10, wherein the first light-emitting dopant and the second light-emitting dopant are configured to emit lights of the same color.

12. The organic electroluminescence device of claim 10, wherein the first sub emission layer is a blue emission layer, the second sub emission layer is a green emission layer, and the third sub emission layer is a red emission layer.

13. The organic electroluminescence device of claim 1, wherein the first light-emitting host comprises a compound represented by the following Formula 1:

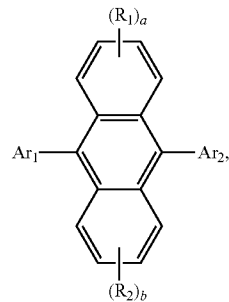

[Formula 1]

wherein $Ar_1$ and $Ar_2$ each independently comprises at least one of a substituted or unsubstituted aryl group of 6 to 30 carbon atoms for forming a ring, and a substituted or unsubstituted heteroaryl group of 2 to 30 carbon atoms for forming a ring,
wherein $R_1$ and $R_2$ each independently comprises at least one of a hydrogen atom, a deuterium atom, a halogen atom, a cyano group, a substituted or unsubstituted silyl group, a substituted or unsubstituted alkyl group of 1 to 20 carbon atoms, a substituted or unsubstituted alkoxy group of 1 to 10 carbon atoms, a substituted or unsubstituted aryl group of 6 to 30 carbon atoms for forming a ring, a substituted or unsubstituted aryloxy group of 6 to 30 carbon atoms for forming a ring, and a substituted or unsubstituted heteroaryl group of 2 to 30 carbon atoms for forming a ring, and combined with an adjacent group to form a ring, and
wherein "a" and "b" are each independently an in integer of 0 to 4.

14. An organic electroluminescence device, comprising:
a first pixel area, a second pixel area, and a third pixel area, which are neighbored in a plan view, each of the first pixel area, the second pixel area, and the third pixel area comprising:
a first electrode;
a hole transport region disposed on the first electrode;
a first emission layer disposed on the hole transport region, the first emission layer comprising:
a first sub emission layer overlapping with the first pixel area in the plan view;
a second sub emission layer overlapping with the second pixel area in the plan view; and
a third sub emission layer overlapping with the third pixel area in the plan view;
a second emission layer disposed on the first emission layer, the second emission layer overlapping with the first pixel area, the second pixel area, and the third pixel area in the plan view;
an electron transport region disposed on the second emission layer; and
a second electrode disposed on the electron transport region,
wherein the first sub emission layer comprises a first light-emitting host and a first light-emitting dopant,
wherein the second emission layer comprises a first electron transport material and a second light-emitting dopant,
wherein the electron transport region comprises a second electron transport material, and
wherein a triplet energy of the first light-emitting host ($T1_a$), a triplet energy of the second light-emitting dopant ($T1_b$) and a triplet energy of the second electron transport material ($T1_c$) satisfy a relation of $T1_a<T1_b<T1_c$, and wherein the first electron transport material of the second emission layer and the second electron transport material of the electron transport region are a same material.

15. The organic electroluminescence device of claim 14, wherein a difference between the triplet energy of the second light-emitting dopant and the triplet energy of the first light-emitting host ($T1_b-T1_a$) is equal to or greater than about 0.4 eV.

16. The organic electroluminescence device of claim 14, wherein a difference between the triplet energy of the second electron transport material and the triplet energy of the second light-emitting dopant ($T1_c-T1_b$) is equal to or greater than about 0.5 eV.

17. The organic electroluminescence device of claim 14, wherein the electron transport region comprises:
a buffer layer;
an electron transport layer disposed on the buffer layer; and
an electron injection layer disposed on the electron transport layer,
wherein the buffer layer comprises the second electron transport material and the buffer layer is adjacent to the second emission layer.

18. The organic electroluminescence device of claim 14, wherein the first light-emitting dopant and the second light-emitting dopant are configured to emit blue light.

19. The organic electroluminescence device of claim 14, wherein the second light-emitting dopant is doped in a weight ratio of equal to or greater than about 3% and equal to or less than about 10% with respect to the first electron transport material.

20. An organic electroluminescence device, comprising:
a first pixel area, a second pixel area, and a third pixel area, which are neighbored in a plan view, each of the first pixel area, the second pixel area, and the third pixel area comprising:
a first electrode;
a hole transport region disposed on the first electrode;
a first emission layer disposed on the hole transport region, the first emission layer comprising:
a first sub emission layer overlapping with the first pixel area in the plan view;
a second sub emission layer overlapping with the second pixel area in the plan view; and
a third sub emission layer overlapping with the third pixel area in the plan view;
a second emission layer disposed on the first emission layer, the second emission layer overlapping with the first pixel area, the second pixel area, and the third pixel area in the plan view;
a buffer layer disposed on the second emission layer;
an electron transport layer disposed on the buffer layer;
an electron injection layer disposed on the electron transport layer; and
a second electrode disposed on the electron injection layer,
wherein the first sub emission layer comprises a first light-emitting host and a first light-emitting dopant,
wherein the second emission layer comprises a first electron transport material and a second light-emitting dopant, and
wherein the buffer layer comprises a second electron transport material, and
wherein a triplet energy of the first light-emitting host ($T1_a$), a triplet energy of the second light-emitting dopant ($T1_b$) and a triplet energy of the second electron transport material ($T1_c$) satisfy a relation of $T1_a<T1_b<T1_c$, and
wherein the first electron transport material of the second emission layer and the second electron transport material of the electron transport region are a same material.

* * * * *